(12) United States Patent
Kim

(10) Patent No.: US 12,015,024 B2
(45) Date of Patent: Jun. 18, 2024

(54) BODY BIAS VOLTAGE GENERATOR AND SEMICONDUCTOR DEVICE INCLUDING THE SAME PRELIMINARY CLASS

(71) Applicant: Samsung Electronics Co., Ltd., Suwon-si (KR)

(72) Inventor: Youngjae Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/060,244

(22) Filed: Nov. 30, 2022

(65) Prior Publication Data
US 2023/0317710 A1 Oct. 5, 2023

(30) Foreign Application Priority Data
Mar. 29, 2022 (KR) .................. 10-2022-0038639

(51) Int. Cl.
| | | |
|---|---|---|
| *H02M 3/07* | (2006.01) | |
| *G05F 3/20* | (2006.01) | |
| *G05F 3/26* | (2006.01) | |
| *H01L 27/02* | (2006.01) | |
| *H01L 27/092* | (2006.01) | |
| *H10B 12/00* | (2023.01) | |

(52) U.S. Cl.
CPC .......... *H01L 27/0222* (2013.01); *G05F 3/205* (2013.01); *G05F 3/26* (2013.01); *H01L 27/0928* (2013.01); *H02M 3/073* (2013.01); *H02M 3/078* (2021.05); *H10B 12/50* (2023.02)

(58) Field of Classification Search
None
See application file for complete search history.

(56) References Cited

U.S. PATENT DOCUMENTS

| | | | | |
|---|---|---|---|---|
| 5,682,118 | A * | 10/1997 | Kaenel | G05F 3/24 327/530 |
| 5,900,665 | A * | 5/1999 | Tobita | G11C 5/146 257/E27.084 |
| 6,466,077 | B1 * | 10/2002 | Miyazaki | G05F 3/205 327/276 |
| 6,518,825 | B2 | 2/2003 | Miyazaki et al. | |
| 6,867,637 | B2 | 3/2005 | Miyazaki et al. | |
| 7,495,471 | B2 | 2/2009 | Perisetty | |
| 7,880,531 | B2 * | 2/2011 | Park | H02M 3/073 327/306 |

(Continued)

FOREIGN PATENT DOCUMENTS

KR 10-2009-0040460 A 4/2009

*Primary Examiner* — Thomas J. Hiltunen
(74) *Attorney, Agent, or Firm* — Harness, Dickey & Pierce, P.L.C.

(57) ABSTRACT

A body bias voltage generating circuit includes a current mirror circuit configured to generate and input a target current to a target semiconductor element, the target semiconductor element configured to be set to a turned-on state; and a charge pump circuit including an oscillator configured to output a clock signal based on a result of comparing an output voltage of the target semiconductor element with a reference voltage, and at least one charge pump outputting a body bias voltage to each of a plurality of semiconductor elements, wherein each of the plurality of semiconductor elements is the same as or is the same type as the target semiconductor element.

17 Claims, 16 Drawing Sheets

(56) References Cited

U.S. PATENT DOCUMENTS

| | | | |
|---|---|---|---|
| 7,911,261 B1* | 3/2011 | Shamarao | G05F 3/08 |
| | | | 327/535 |
| 8,217,712 B2* | 7/2012 | Miyatake | G05F 1/46 |
| | | | 327/536 |
| 8,659,346 B2* | 2/2014 | Ogawa | G05F 3/205 |
| | | | 327/535 |
| 9,088,280 B2 | 7/2015 | Jarrar et al. | |
| 9,251,866 B2 | 2/2016 | Chun | |
| 9,361,994 B1 | 6/2016 | Kouznetsov | |
| 10,615,790 B1 | 4/2020 | Delshadpour et al. | |
| 10,658,927 B1 | 5/2020 | Pelicia et al. | |
| 2008/0061346 A1 | 3/2008 | Tang et al. | |
| 2010/0164607 A1* | 7/2010 | Miyatake | G05F 1/46 |
| | | | 327/537 |

* cited by examiner

BODY BIAS VOLTAGE GENERATOR AND SEMICONDUCTOR DEVICE INCLUDING THE SAME PRELIMINARY CLASS

CROSS-REFERENCE TO RELATED APPLICATION(S)

This application claims benefit of priority to Korean Patent Application No. 10-2022-0038639 filed on Mar. 29, 2022 in the Korean Intellectual Property Office, the disclosure of which is incorporated herein by reference in its entirety.

BACKGROUND

Various example embodiments relates to a body bias voltage generator and/or a semiconductor device including the same.

A semiconductor device may include a voltage generator or voltage generating circuit generating a power supply voltage, required or used for operation thereof, using an external power supply voltage provided by an external host, or the like, and the voltage generator may generate a bias voltage required or used for operation of a plurality of semiconductor elements included in the semiconductor device. As an example, the voltage generator may output a body bias voltage, which is input to a body terminal of each of the semiconductor elements, to reduce a characteristic distribution of the plurality of semiconductor elements. To significantly reduce the characteristic distribution of the semiconductor elements, the body bias voltage of the semiconductor element needs to or is desired to be adaptively controlled in consideration of process variations and the like.

SUMMARY

Various example embodiments provide a body bias voltage, which adaptively adjust a body bias voltage input to a body terminal of a semiconductor element to significantly reduce a difference between a target current and an ON-current flowing through the semiconductor element when the semiconductor element is in a turned-on state, and a semiconductor device including the body bias voltage generator.

According to various example embodiments, a body bias voltage generator includes a current mirror circuit configured to generate and to input a target current to a target semiconductor element, the target semiconductor element being in a turned-on state; and a charge pump circuit including an oscillator configured to output a clock signal based on a result of comparing an output voltage of the target semiconductor element with a reference voltage, and at least one charge pump configured to output a body bias voltage to each of a plurality of semiconductor elements, wherein each of the plurality of semiconductor elements has a same electrical characteristic or the same conductivity type as the target semiconductor element.

According to an example embodiment, a body bias voltage generator includes: a plurality of first semiconductor elements in a first impurity region; a plurality of second semiconductor elements in a second impurity region, different from the first impurity region; a first comparator configured to compare an output voltage of a first target semiconductor element with a reference voltage, the first target semiconductor element having a same electrical characteristic or the same conductivity type as the plurality of first semiconductor elements and configured to receive a first target current; a first charge pump circuit including a first oscillator configured to operate based on an output of the first comparator, and at least one negative charge pump configured to output a negative voltage in response to a first clock signal output by the first oscillator; a second comparator configured to compare an output voltage of a second target semiconductor element with the reference voltage, the second target semiconductor element having a same conductivity type the plurality of second semiconductor elements and configured to receive a second target current; and a second charge pump circuit including a second oscillator configured to operate based on an output of the second comparator, and a second charge pump circuit configured to output a positive voltage in response to a second clock signal output by the second oscillator.

According to various example embodiments, a semiconductor device includes a memory cell array in which a plurality of memory cells are arranged; and a peripheral circuit connected to the memory cell array through a plurality of wordlines and a plurality of bitlines and configured to control the plurality of memory cells. The peripheral circuit includes a plurality of semiconductor elements and a body bias adjustment circuit configured to adjust a body bias voltage of at least one of the plurality of semiconductor elements. The body bias adjustment circuit includes a target semiconductor element having a same electrical characteristic or the same conductivity type as the at least one semiconductor element, a comparator configured to compare an output voltage of the target semiconductor element with a reference voltage, and a charge pump configured to adjust a body bias voltage input to a body terminal of each of the at least one semiconductor element and the target semiconductor element based on an output of the comparator.

BRIEF DESCRIPTION OF DRAWINGS

The above and other aspects, features, and advantages of the inventive concepts will be more clearly understood from the following detailed description, taken in conjunction with the accompanying drawings.

DETAILED DESCRIPTION

Hereinafter, example embodiments will be described with reference to the accompanying drawings.

Figure 1A:
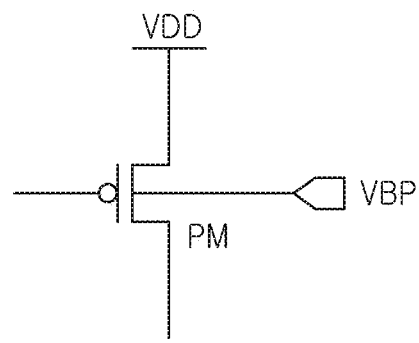
FIGS. 1A and 1B are views illustrating operations of semiconductor elements included in a semiconductor device according to various example embodiments.
Figure 1B:
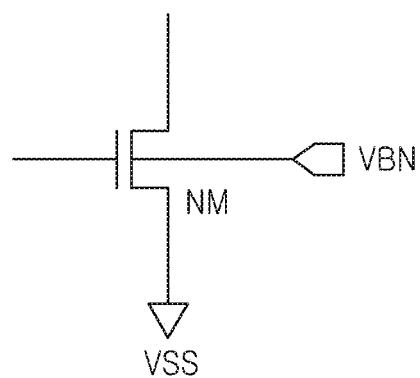

FIGS. 1A and 1B are views illustrating operations of semiconductor elements included in a semiconductor device according to various example embodiments.

A semiconductor device according to various example embodiments may include a plurality of semiconductor elements. For example, the semiconductor elements may include a P-channel metal oxide semiconductor (PMOS) device PM and an N-channel metal oxide semiconductor (NMOS) element NM, and/or the like. As illustrated in FIGS. 1A and 1B, body bias voltages VBP and VBN may be input to the PMOS element PM and the NMOS element NM, respectively.

Referring to FIG. 1A, a PMOS body bias voltage VBP may be input to a body terminal of the PMOS element PM. Referring to FIG. 1B, the NMOS body bias voltage VBN may be input to a body terminal of the NMOS element NM. In various example embodiments, the PMOS body bias voltage VBP and the NMOS body bias voltage VBN may have different signs or different polarity; for example one of the NMOS body bias voltage VBN and the PMOS body bias voltage VBP may be positive, and the other of the NMOS body bias voltage VBN and the PMOS body bias voltage VBP may be negative. Either or both of the PMOS element PM and the NMOS element NM may be planar transistors; however, example embodiments are not limited thereto, and either or both of the PMOS element PM and the NMOS element NM may be three-dimensional transistors.

As an example, the PMOS body bias voltage VBP may be a positive voltage having a positive sign, while the NMOS body bias voltage VBN may be a negative voltage having a negative sign. A threshold voltage of each of the PMOS element PM and the NMOS element NM may be determined and may be based on a source-body voltage, e.g. a difference between a source bias voltage input to a source terminal and the body bias voltage VBP or VBN input to the body terminal. As an example, when the source-body voltage is increased, a threshold voltage may be increased in a linear or nonlinear manner, and when the source-body voltage is decreased, the threshold voltage may be decreased in a linear or nonlinear manner.

A source terminal of the PMOS element PM may receive a first power supply voltage VDD, and the source-body voltage may decrease (e.g. tend closer to zero) as the PMOS body bias voltage VBP is increased. Accordingly, as the PMOS body bias voltage VBP is increased, a threshold voltage of the PMOS element PM may be decreased and current, flowing to the PMOS element PM in a turned-on state, may be increased.

A source terminal of the NMOS element NM may receive a second power supply voltage VSS, and the source-body voltage may decrease (e.g., tend closer to zero) as the NMOS body bias voltage VBN is increased, for example, an absolute value of the NMOS body bias voltage VBN having a negative sign is decreased. Accordingly, as the NMOS body bias voltage VBN is increased, a threshold voltage of the NMOS element NM may decrease and current, flowing to the NMOS element NM in a turned-on state, may increase.

As described above, by adjusting the body bias voltages VBP and VBN, the threshold voltage of each of the semiconductor elements PM and NM may be adjusted, independently or concurrently, and the amount of current flowing in the turned-on state can may also be adjusted. Characteristics of the semiconductor elements PM and NM may vary depending on various factors, such as but not limited to one or more process deviations occurring in a process of fabricating the semiconductor device including the semiconductor elements PM and NM, a magnitude of the external power supply voltage input to the semiconductor device from an external host or power supply device, internal and external temperatures of the semiconductor device, and the like. Accordingly, deviation of the characteristics may be increased.

In various example embodiments, characteristics to be achieved in each of the semiconductor elements PM and NM may be compared with a reference value so as to reduce or significantly reduce a deviation of the characteristics of the semiconductor elements PM and NM, and the body bias voltages VBP and VBN may be independently adaptively adjusted based on a result of the comparison. Accordingly, the characteristics of the semiconductor elements PM and NM, for example, a threshold voltage or ON current flowing in a turned-on state may be set to be distributed in a narrow range, resulting in improved performance of the semiconductor device.

Figure 2:
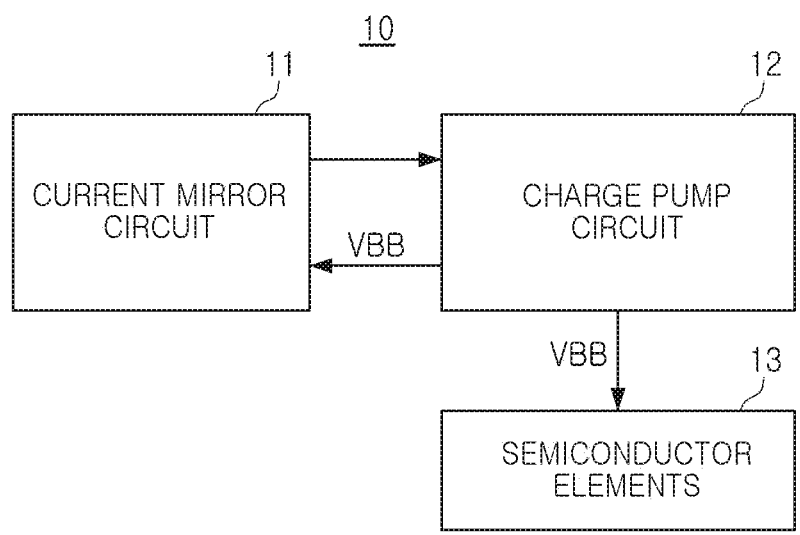
FIG. 2 is a schematic block diagram of a semiconductor device according to various example embodiments.

FIG. 2 is a schematic block diagram of a semiconductor device according to various example embodiments.

Referring to FIG. 2, a semiconductor device 10 according to some example embodiments may include a current mirror circuit 11, a charge pump circuit 12, and a plurality of semiconductor elements 13. The current mirror circuit 11 may include a target semiconductor element having the same type (e.g. the same conductivity type such as each NMOS or each PMOS, and/or the same electrical characteristics and/or the same geometric characteristics and/or the same design characteristics) as at least some of the plurality of semiconductor elements 13, and may apply target current to the target semiconductor element set to a turned-on state. For example, when elements receiving the body bias voltage VBB, among the plurality of semiconductor elements 13, are NMOS elements, the target semiconductor element may also be an NMOS element. When elements receiving the body bias voltage VBB, among the plurality of semiconductor elements 13, are PMOS elements, the target semiconductor element may also be a PMOS element.

The charge pump circuit 12 may include at least one of a charge pump, an oscillator, and/or the like. The oscillator may output a clock signal determining an output of the charge pump. As an example, an output voltage of the charge pump may vary depending on a frequency of the clock signal. When the frequency of the clock signal is increased, the output voltage may be increased. When the frequency of the clock signal is decreased, the output voltage may be decreased.

As an example, a voltage output by the current mirror circuit 11 may determine whether the oscillator included in the charge pump circuit 12 operates. The charge pump circuit 12 may include a comparator comparing the output voltage of the target semiconductor element, included in the current mirror circuit 11, with a dynamically determined (or, alternatively, predetermined) reference voltage. The comparator may output a control signal determining whether the oscillator operates. As an example, when the output voltage of the target semiconductor element is less than the reference voltage (e.g. less in absolute value than), the oscillator may be activated by the control signal and the charge pump may supply the body bias voltage VBB to the plurality of semiconductor element 13 and the target semiconductor element by the clock signal output by the oscillator.

Figure 3:
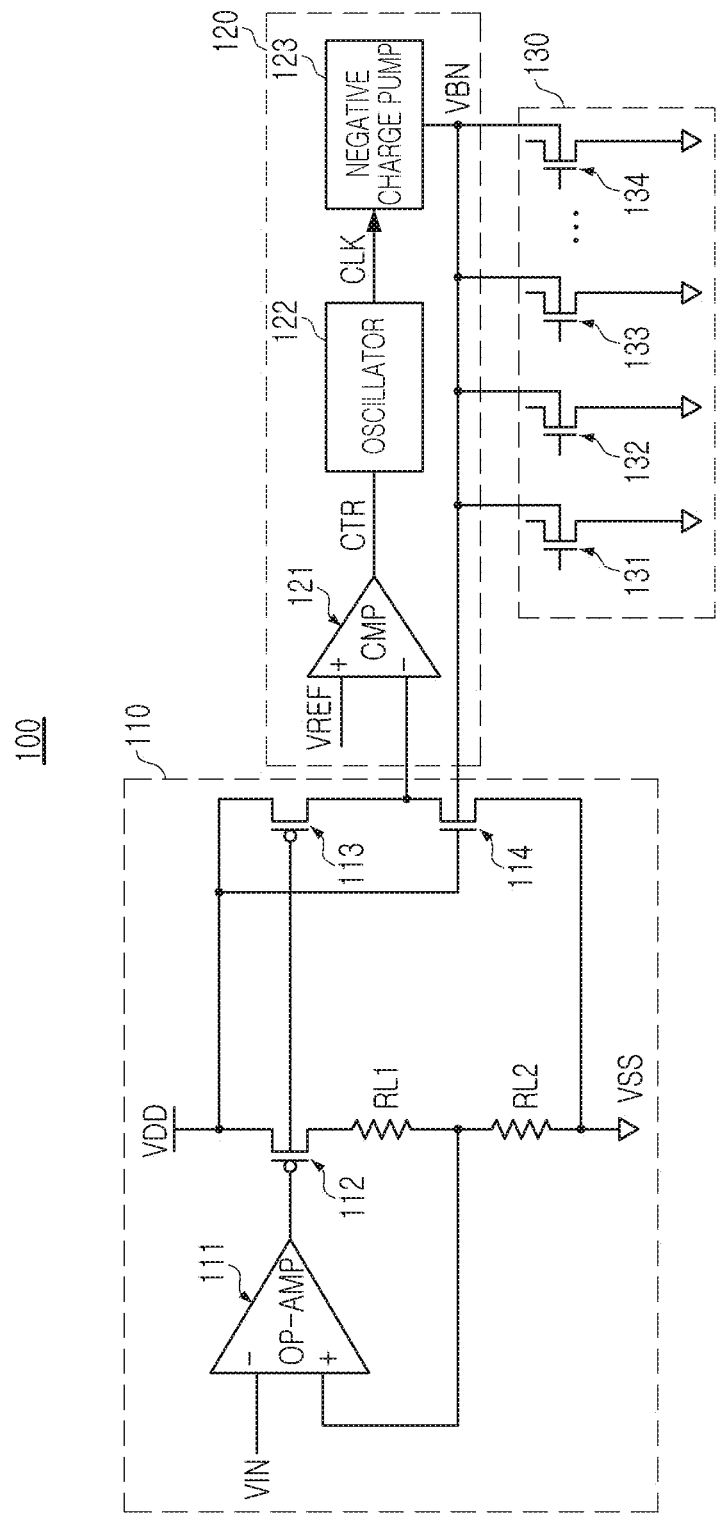
FIG. 3 is a schematic view illustrating a semiconductor device according to various example embodiments.

FIG. 3 is a schematic view illustrating a semiconductor device according to various example embodiments.

Referring to FIG. 3, a semiconductor device 100 according to various example embodiments may include a current mirror circuit 110, a charge pump circuit 120, and a plurality of semiconductor elements 131 to 134 (130 generally). The current mirror circuit 110 and the charge pump circuit 120 may provide a voltage generator outputting a body bias voltage input to body terminals of the plurality of semiconductor elements 130.

The current mirror circuit 110 may include an operational amplifier 111, a first PMOS element 112, a second PMOS element 113, a first NMOS element 114, and the like. An output terminal of the operational amplifier 111 may be connected to a gate of the first PMOS element 112. An input voltage VIN may be input to an inverting input terminal of the operational amplifier 111, and a non-inverting input terminal of the operational amplifier 111 may be connected to a node between a first load resistor RL1 and a second load resistor RL2. The first PMOS element 112 may receive the first power supply voltage VDD. The first load resistor RL1 and the second load resistor RL2 may be connected between the first PMOS element 112 and a node to which the second power supply voltage VSS is input. A level of the first power supply voltage VDD may be higher or greater than a level of the second power supply voltage VSS.

Current flowing to the first PMOS element 112 and the first load resistor RL1 and the second load resistor RL2 may be determined by a voltage output to a gate of the first PMOS element 112 by the operational amplifier 111. As an example, the current flowing through the first PMOS element 112 may be adjusted such that a voltage on the node between the first load resistor RL1 and the second load resistor RL2 is equal to the input voltage VIN. Accordingly, the magnitude of the current flowing through the first PMOS element 112 may vary depending on the level of the input voltage VIN input to the operational amplifier 111.

The gate of the second PMOS element 113 may be connected to the gate of the first PMOS element 112, and thus, the same current as current flowing through the first PMOS element 113 may flow to the second PMOS element 113 and the first NMOS element 114. A gate of the first NMOS element 114 may receive the first power supply voltage VDD, and thus, the first NMOS element 114 may be maintained in a turned-on state. The first NMOS element 114 may be or may correspond to a target semiconductor element.

The comparator 121 included in the charge pump circuit 120 may compare an output voltage of the first NMOS element 114 (a target semiconductor element) with a reference voltage VREF. As an example, when the output voltage of the first NMOS element 114 is lower than or less than the reference voltage VREF, a control signal CTR output by the comparator 121 may be set to a logic high level, and when the output voltage of the first NMOS element 114 is higher than or greater than the reference voltage VREF, the control signal CTR may be set to a logic low level. When the control signal CTR is at the high logic level, the oscillator 122 outputs the clock signal CLK, and when the control signal CTR is at the low logic level, the oscillator 122 may not output the clock signal CLK. In various example embodiments, the level of the reference voltage VREF may be half (½ʙ of the level of the first power supply voltage VDD.

When the oscillator 122 outputs the clock signal CLK, a negative charge pump 123 may output the body bias voltage VBN to the plurality of semiconductor elements 130. In example embodiments illustrated in FIG. 3, each of the plurality of semiconductor elements 130 may be the same NMOS element as the target semiconductor element, e.g. may have the same conductivity type or the same structure and/or the same electrical characteristics and/or the same design features. The body bias voltage VBN output by the negative charge pump 123 may also be input to the body terminal of the first NMOS element 114, a target semiconductor element.

As an example, in the case in which the output voltage of the first NMOS element 114 is lower than or less than the reference voltage VREF, the case may correspond to a case in which resistance of the first NMOS element 114 in a turn-on state is relatively low. Accordingly, the comparator 121 may output a control signal CTR having a logic high level and the negative charge pump 123 may supply the body bias voltage VBN to the body terminal of the first NMOS element 114 by the clock signal CLK output by the oscillator 122.

As illustrated in the following Equation 1, a threshold voltage of the first NMOS element 114 may vary depending on the body bias voltage VBN. In Equation 1, $V_{TH}$ is the threshold voltage of the first NMOS element 114, $V_{TH0}$ is a threshold voltage when there is no difference in voltages between a source and a body, γ is a coefficient determined depending on a body effect, $\Phi_S$ is a built-in potential, and $V_{SB}$ is the difference in voltages between the source and the body. Accordingly, as the body bias voltage VSB input to the body terminal of the first NMOS element 114 is decreased, the threshold voltage of the first NMOS element 114 may be increased.

$$V_{TH}=V_{TH0}+\gamma(\sqrt{\Phi_S+V_{SB}}-\sqrt{\Phi_S})$$ [Equation 1]

The body bias voltage VBN output by the negative charge pump 123 may be a negative voltage having a level, lower than a level of the second power supply voltage VSS. As the body bias voltage VBN is decreased, for example, as an absolute value of the body bias voltage VBN is increased, the threshold voltage of the first NMOS element 114 may be increased. When the threshold voltage of the first NMOS element 114 is increased in a state in which the first power supply voltage VDD is input to the gate of the first NMOS element 114, the current flowing through the first NMOS element 114 may decrease.

According to various example embodiments, the comparator 121 may determine a voltage level of the control signal CTR to be different depending on a difference between the output voltage of the first NMOS element 114 and the reference voltage VREF, and the oscillator 122 may control a frequency of the clock signal CLK in response to the control signal CTR. As an example, when the output voltage of the first NMOS element 114 is lower than the reference voltage VREF, the frequency of the clock signal CLK may vary depending on the difference between the output voltage and the reference voltage VREF. For example, as the difference between the output voltage and the reference voltage VREF is increased, the oscillator 122 may increase the frequency of the clock signal CLK. Accordingly, the body bias voltage VBN output by the negative charge pump 123 may be further decreased, and the threshold voltage of the first NMOS element 114 may be further increased.

When the output voltage of the first NMOS element 114 is higher than or greater than the reference voltage VREF, the control signal CTR may be set to a logic low level. In this case, the oscillator 122 may stop outputting the clock signal CLK, and the negative charge pump 123 may not output the body bias voltage VBN. Accordingly, the threshold voltage of the first NMOS element 114 may be maintained as it is, and the current flowing through the first NMOS element 114 may not be changed.

Alternatively, when the output voltage of the first NMOS element 114 is higher than or greater than the reference voltage VREF, the oscillator 122 may decrease the frequency of the clock signal CLK to increase the body bias voltage VBN output by the negative charge pump 123. Since the body bias voltage VBN is a negative voltage, the absolute value of the body bias voltage VBN may decrease. Thus, the threshold voltage of the first NMOS element 114 may be decreased to increase current flowing through the first NMOS element 114.

As a result, in various example embodiments illustrated in FIG. 3, when the current flowing through the first NMOS element 114 in the turned-on state is relatively high, the charge pump circuit 120 may output the body bias voltage VBN to increase the threshold voltage of the first NMOS element 114. Accordingly, the current of the first NMOS element 114 may be decreased to the target current. Meanwhile, when the current flowing through the first NMOS element 114 in the turned-on state is relatively low, the charge pump circuit 120 may stop outputting the body bias voltage VBN and the threshold voltage of the first NMOS element 114 may not be changed.

The target current may vary depending on the input voltage VIN input to the current mirror circuit 110. Accordingly, the input voltage VIN may be adjusted to set target current to flow to the first NMOS element 114 in the turned-on state, and the body bias voltage VBN of the first NMOS element 114 may be adjusted to allow the target current to flow.

The body bias voltage VBN may also be input to each of the plurality of semiconductor elements 130 which are the same as the first NMOS element 114. As an example, the input voltage VIN may be adjusted depending to the current to flow when each of the plurality of semiconductor elements 130 is in a turned-on state, and the level of the body bias voltage VBN may be determined therefrom. The body bias voltage VBN may be supplied to the body terminal of each of the plurality of semiconductor elements 130 to significantly reduce a deviation of current flowing when each of the plurality of semiconductor elements 130 is in a turned-on state.

In various example embodiments, a level change of the body bias voltage VBN adjusted by the negative charge pump 123 may be affected by other voltages input to the plurality of semiconductor elements 130. For example, the target semiconductor element 114 may receive the first power supply voltage VDD to the gate terminal thereof to be maintained in the turned-on state, and the output voltage of the target semiconductor element 114 may be affected from the first power supply voltage VDD. Accordingly, in various example embodiments, the body bias voltage VBN output by the negative charge pump 123 may be changed depending on a change in another voltage such as the first power supply voltage VDD.

For example, when the first power supply voltage VDD is increased, the negative charge pump 123 may decrease the body bias voltage VBN to increase the threshold voltage of the target semiconductor element 114, so that the target semiconductor element 114 may be significantly decreased. Accordingly, in various example embodiments, even when another voltage such as the first power supply voltage VDD is unintentionally changed, a change in turn-on current flowing in each of the plurality of semiconductor elements 130 in a turned-on state may be significantly reduced.

Figure 4:
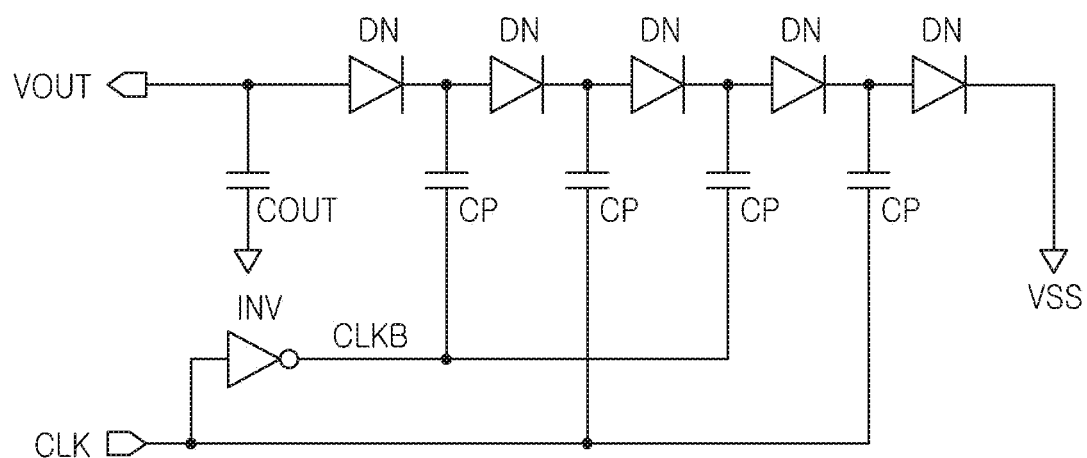
FIG. 4 is a schematic circuit diagram illustrating a charge pump circuit included in a body bias voltage generator according to various example embodiments.

FIG. 4 is a schematic circuit diagram illustrating a charge pump circuit included in a body bias voltage generator according to various example embodiments.

A charge pump described with reference to FIG. 4 may be applied as the negative charge pump 123 in the semiconductor device 100 as in the example embodiment illustrated in FIG. 3. As an example, a charge pump included in a body bias voltage generator according to various example embodiments may include a plurality of diodes DN, a plurality of pumping capacitors CP, an output capacitor COUT, and the like.

The plurality of diodes DN may be connected to each other in series, and a plurality of pumping capacitors CP may be connected to a node between the plurality of diodes DN. A first diode may receive a power supply voltage VSS less than zero, and thus an output voltage VOUT less than zero may be generated by the charge pump according to the example embodiment illustrated in FIG. 4. Each of the plurality of pumping capacitors CP may be charged or discharged by the clock signal CLK or the complementary clock signal CLKB phase-shifted to have an opposite phase to the clock signal CLK by the inverter INV. Each of the plurality of pumping capacitors CP may be cylindrical capacitors, or may be planar capacitors; example embodiments are not limited thereto.

Figure 5:
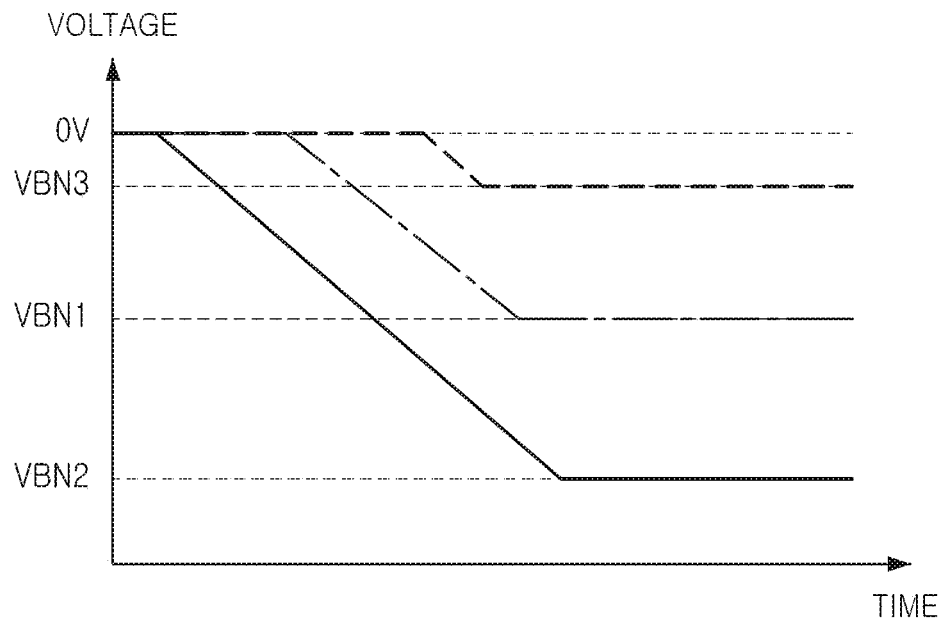
FIGS. 5 and 6 are views illustrating an operation of a body bias voltage generator according to various example embodiments.
Figure 6:
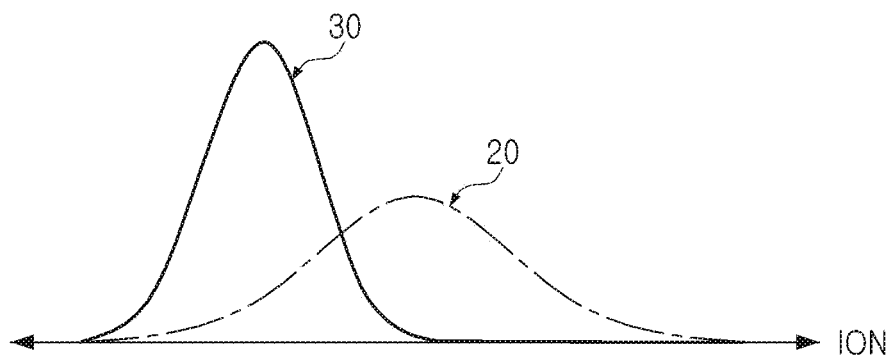

FIGS. 5 and 6 are views illustrating an operation of a body bias voltage generator according to various example embodiments.

FIG. 5 may be a view illustrating an operation of a body bias voltage generator according to characteristics of respective semiconductor elements in the semiconductor device according to various example embodiments. Referring to FIG. 5, a body bias voltage of each of the semiconductor elements may be set to one of first to third body bias voltages VBN1 to VBN3.

In various example embodiments, the body bias voltage may be adaptively adjusted depending on target current to flow to a semiconductor element in a turned-on state. For example, in the current mirror circuit as described with reference to FIG. 3, the target current may be set by adjusting the input voltage VIN input to the operational amplifier, and an output of the charge pump circuit may be adjusted such that the target current flows to a target semiconductor element included in the current mirror circuit. The output of the charge pump circuit may be input to body terminals of the target semiconductor element and other semiconductor elements such as target semiconductor elements.

As an example, the body bias voltage output by the charge pump circuit may be set to an initial level of a first body bias voltage VBN1. When the current flowing through the target semiconductor element is higher than the target current while inputting the first body bias voltage to the body terminal of the target semiconductor element, the charge pump circuit may change the body bias voltage to a second body bias voltage VBN2. As the body bias voltage decreases from the first body bias voltage VBN1 to the second body bias voltage VBN2, the threshold voltage of the target semiconductor element may be increased to reduce a difference between the current flowing through the target semiconductor element and the target current.

Meanwhile, when the current flowing through the target semiconductor element is lower than the target current while inputting the first body bias voltage to the body terminal of the target semiconductor element, the charge pump circuit may increase the body bias voltage to a third body bias voltage VBN3. As the body bias voltage is increased to the third body bias voltage VBN3, the threshold voltage of the target semiconductor element may be decreased and a difference between the current flowing through the target semiconductor element and the target current may be reduced.

The body bias voltage, having a level adaptively adjusted through the above process depending on the characteristics of the target semiconductor element, may be input to a body terminal of each of the other semiconductor elements having the same type as the target semiconductor element. Accordingly, a deviation of current flowing when each of the semiconductor elements is in a turned-on state may be reduced, and performance of the semiconductor device may be improved.

FIG. 6 is a view illustrating a distribution of turn-on current ION flowing to each of semiconductor elements in a turned-on state before and after adjusting a body bias voltage output by a body bias voltage generator in the semiconductor device according to various example embodiments. The turn-on current ION may be current flowing when each of the semiconductor devices is in a turned-on state. Referring to FIG. 6, before adjusting the body bias voltage, the current flowing through each of the semiconductor elements in the turned-on state may be distributed within a wide range, as represented by a first graph 20.

A second graph 30 of FIG. 6 may represent a distribution of currents, respectively flowing to the respective semiconductor elements, after a body bias voltage generator adaptively adjusts a body bias voltage based on target current to flow to each of the semiconductor elements in a turned-on state. As illustrated in FIG. 6, the second graph 30 may be distributed in a relatively narrower range than the first graph 20.

As an example, the second graph 30 may correspond to a case in which a current distribution is adjusted in a manner of inputting a relatively low body bias voltage to each of the semiconductor elements, to which current higher than target current flows in a turned-on state, to increase a threshold voltage. Accordingly, as illustrated in FIG. 6, the current distribution in the second graph 30 may be concentrated in a relatively narrower range, as compared with the current distribution in the first graph 20.

Figure 7:
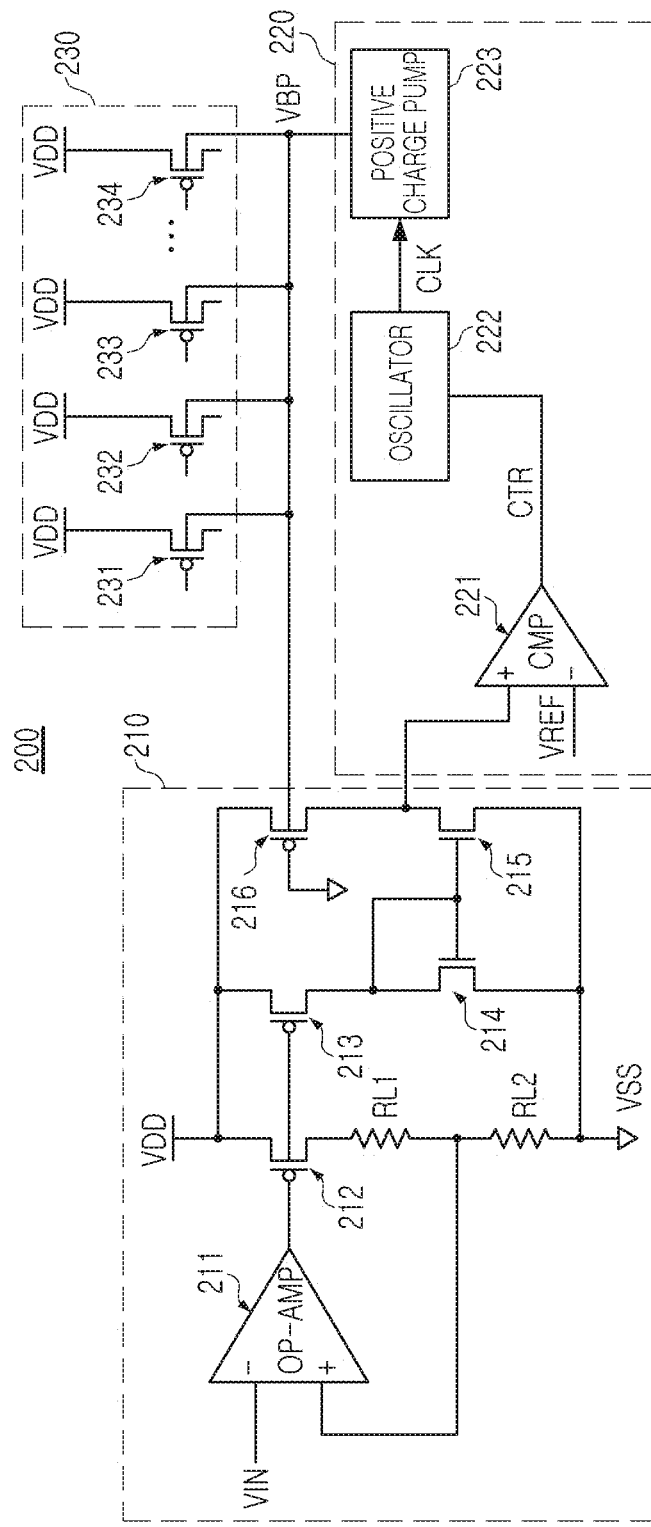
FIG. 7 is a schematic view illustrating a semiconductor device according to various example embodiments.

FIG. 7 is a schematic view illustrating a semiconductor device according to various example embodiments.

Referring to FIG. 7, a semiconductor device 200 according to various example embodiments may include a current mirror circuit 210, a charge pump circuit 220, a plurality of semiconductor elements 231 to 234 (230 generally), and the like. The current mirror circuit 210 and the charge pump circuit 220 may provide a voltage generator outputting a body bias voltage VBP input to body terminals of the plurality of semiconductor elements 230.

The current mirror circuit 210 may include an operational amplifier 211, a first PMOS element 212, a second PMOS element 213, a first NMOS element 214, a second NMOS element 215, a third PMOS element 216, and the like.

Configurations of the operational amplifier 211, the first PMOS element 212, the second PMOS element 213, and the first NMOS element 214 may be similar to those described above with reference to FIG. 3. For example, an output terminal of the operational amplifier 211 may be connected to a gate of the first PMOS element 212, and an input terminal of the first PMOS element 212 may receive a first power supply voltage VDD. An output terminal of the first PMOS element 212 may be connected to a first load resistor RL1 and a second load resistor RL2.

In various example embodiments illustrated in FIG. 7, the current mirror circuit 210 may further include a second NMOS element 215 and a third PMOS element 216, and the second NMOS element 215 and the second NMOS element 215. 3 The PMOS element 216 may replicate current flowing through the first NMOS element 214. As illustrated in FIG. 7, among input terminals of the comparator 221 included in the charge pump circuit 220, one input terminal may be connected to a node between the second NMOS element 215 and the third PMOS element 216 and may receive an output voltage of the third PMOS element 216 maintained in a turned-on state. Accordingly, the comparator 221 may compare the output voltage of the third PMOS element 216, a target semiconductor element, with a reference voltage VREF.

When an output voltage of the third PMOS element 216 is higher than the reference voltage VREF, a control signal CTR output by the comparator 221 may be set to a logic high level. When the output voltage of the third PMOS element 216 is lower than the reference voltage VREF, the control signal CTR may be set to a logic low level. When the control signal CTR is on a logic high level, the oscillator 222 may output the clock signal CLK. When the control signal CTR is on a logic low level, the oscillator 222 may not output the clock signal CLK.

When the oscillator 222 outputs the clock signal CLK, the positive charge pump 223 may output a body bias voltage VBP to the plurality of semiconductor elements 230. In various example embodiments illustrated in FIG. 7, each of the plurality of semiconductor elements 230 may be the same PMOS element as the target semiconductor element. The body bias voltage VBP output by the positive charge pump 223 may be a positive voltage, higher than a second power supply voltage VSS.

As an example, a case in which the output voltage of the third PMOS element 216 is higher than the reference voltage VREF may correspond to a case in which resistance of the third PMOS element 216 in a turned-on state is relatively low (current is high, and thus, application of RBB is required). In this case, the comparator 221 may outputs a control signal CTR having a logic high level, and the positive charge pump 223 may supply the body bias voltage VBP to a body terminal of the third PMOS element 216 by the clock signal CLK output by the oscillator 222.

As the body bias voltage VBP is increased, the current flowing through the third PMOS element 216 in the turned-on state may be decreased. As the body bias voltage VBP is decreased, the current flowing through the third PMOS element 216 in the turned-on state may be increased. As the positive charge pump 223 outputs the body bias voltage VBP in response to the clock signal CLK, the threshold voltage of the third PMOS element 216 may be decreased. This may be understood as an increase in the absolute value of the threshold voltage of the third PMOS element 216.

As the body bias voltage VBP is increased, current flowing through the third PMOS device 216 in the turned-on state may be decreased and an output voltage of the third PMOS device 216 may be decreased. The body bias voltage VBP may be adjusted such that the output voltage of the third PMOS device 216 substantially matches the reference voltage VREF. As described above, the body bias voltage VBP may be adjusted to change the threshold voltage of the third PMOS element 216, so that the current flowing through the third PMOS element 216 in the turned-on state may be controlled to match the target current.

Alternatively, when the output voltage of the third PMOS element 216 is lower than the reference voltage VREF, the control signal CTR may be set to a logic low level. In this case, the oscillator 222 may stop outputting the clock signal CLK, and the positive charge pump 223 may not output the body bias voltage VBP. Accordingly, the threshold voltage of the third PMOS element 216 may be maintained as it is, and the current flowing through the third PMOS element 216 may not be changed.

In addition, the comparator 221 may determine a voltage level of the control signal CTR differently to be different depending on a difference between the output voltage of the third PMOS element 216 and the reference voltage VREF, and the oscillator 222 may change a frequency of the clock signal CLK in response to the control signal CTR. As an example, when the output voltage of the third PMOS element 216 is higher than the reference voltage VREF, the oscillator 222 may decrease the frequency of the clock signal CLK to decrease the body bias voltage VBP. Accordingly, the current of the third PMOS element 216 may be increased. Meanwhile, when the output voltage of the third PMOS element 216 is lower than the reference voltage VREF, the oscillator 222 may increase the frequency of the clock signal CLK to increase the body bias voltage VBP. Accordingly, the current of the third PMOS element 216 may be decreased.

As a result, in various example embodiments illustrated in FIG. 7, when the current flowing through the third PMOS element 216 in the turned-on state is relatively high, the charge pump circuit 220 may increase the body bias voltage VBP to decrease a threshold voltage of the third PMOS element 216. Accordingly, the current flowing through the third PMOS element 216 may be decreased to the target current. When the current flowing through the third PMOS element 216 in the turned-on state is relatively low, the body bias voltage VBP may stop being output, and the threshold voltage of the third PMOS element 216 may be maintained at a default value. Accordingly, a current deviation of the semiconductor devices 230 receiving the same body bias voltage VBP as the third PMOS element 216 may be reduced.

As described above, the target current may vary depending on the input voltage VIN input to the current mirror circuit 210. A level of the input voltage VIN may be determined based on target current, current to flow to the third PMOS element 216 in the turned-on state. When the level of the input voltage VIN is determined, the body bias voltage VBP may be adaptively adjusted such that the target current may flow through the third PMOS element 216, a target semiconductor element.

The body bias voltage VBP may also be input to each of the plurality of semiconductor elements 230 which are the same elements as the target semiconductor elements. Accordingly, a deviation of current, flowing when each of the plurality of semiconductor elements 230 is in a turned-on state, may be reduced, and the current flowing through each of the plurality of semiconductor elements 230 may be distributed within a narrow range around the target current. As a result, a deviation of characteristics of the plurality of semiconductor elements 230 may be significantly reduced to improve the performance of the semiconductor device 200.

Figure 8:
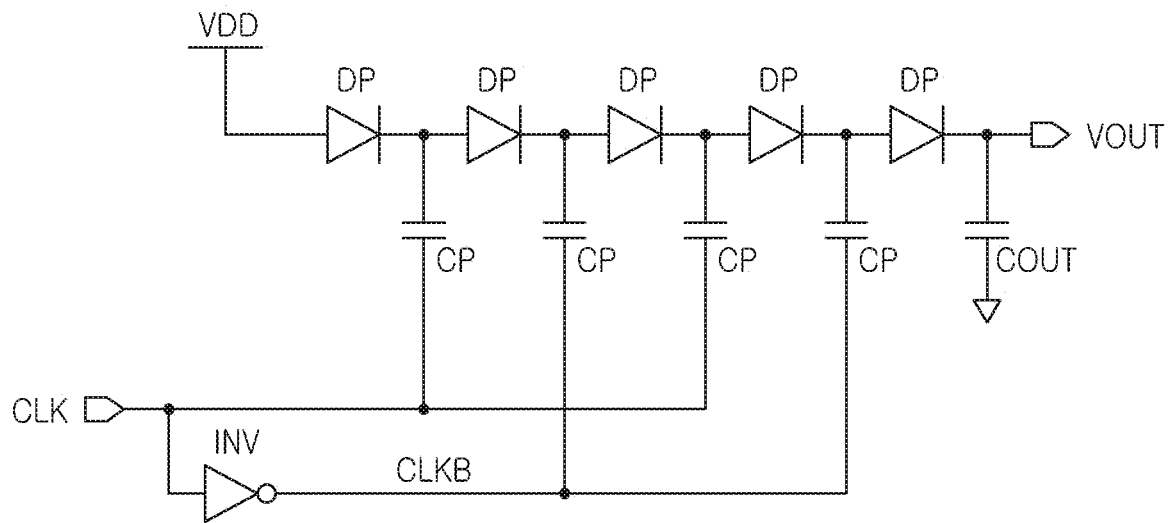
FIG. 8 is a schematic circuit diagram of a charge pump circuit included in a body bias voltage generator according to various example embodiments.

FIG. 8 is a schematic circuit diagram of a charge pump circuit included in a body bias voltage generator according to various example embodiments.

Referring to FIG. 8, a charge pump included in a voltage generator according to various example embodiments may include a plurality of diodes DP, a plurality of pumping capacitors CP, an output capacitor COUT, and the like. The plurality of diodes DP may be connected to each other in series, and the plurality of pumping capacitors CP may be connected to a node between the plurality of diodes DP. A first diode may receive a first power supply voltage VDD having a level higher than 0V, and a last diode may output an output voltage VOUT to an output node. Accordingly, the charge pump according to various example embodiments illustrated in FIG. 8 may output a positive voltage higher than 0V.

Each of the plurality of pumping capacitors CP may be charged or discharged by a clock signal CLK or a complementary clock signal CLKB phase-shifted to have a phase, opposite to a phase of the clock signal CLK, by an inverter INV. As an example, in various example embodiments illustrated in FIG. 8, odd pumping capacitors CP may be charged or discharged by the clock signal CLK, and even pumping capacitors CP may be charged or discharged by the complementary clock signal CLKB.

Figure 9:
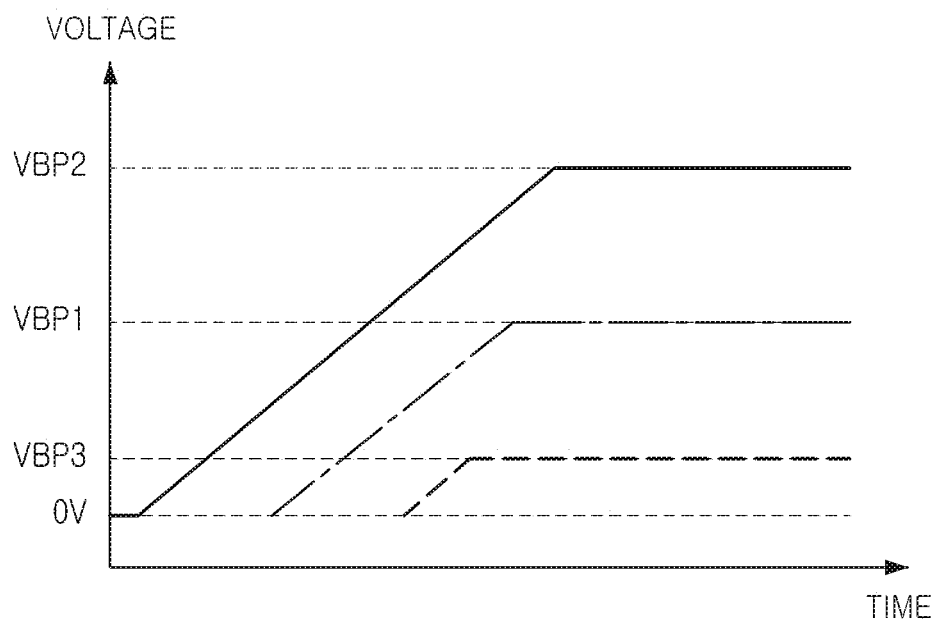
FIG. 9 is a view illustrating an operation of a body bias voltage generator according to various example embodiments.

FIG. 9 is a view illustrating an operation of a body bias voltage generator according to various example embodiments.

FIG. 9 may be a view illustrating an operation of a body bias voltage generator according to characteristics of each of the semiconductor elements in the semiconductor device according to various example embodiments. Referring to FIG. 9, the body bias voltage of each of the semiconductor elements may be set to one body bias voltage, among first to third body bias voltages VBP1 to VBP3. Each of the first to third body bias voltages VBP1 to VBP3 may be a positive voltage higher than 0V, for example, a body bias voltage input to PMOS elements.

The first body bias voltage VBP1 may be basically input to a body terminal of each of the semiconductor elements, PMOS elements. However, in various example embodiments, the body bias voltage input to the body terminal of each of the semiconductor devices may not be fixed to the first body bias voltage VBP1, and may be adaptively adjusted to significantly reduce a deviation of current flowing when each of the semiconductor devices is in a turned-on state.

For example, in the current mirror circuit described with reference to FIG. 7, the input voltage VIN input to the operational amplifier may be adjusted to set the target current. The input voltage VIN may be set to a level of a voltage required to match current, flowing through each of the semiconductor elements in the turned-on state, with the target current. An output of the charge pump circuit may be adjusted such that the target current flows through a target semiconductor element according to the input voltage VIN, and the output of the charge pump circuit may be input to the body terminals of the semiconductor elements.

When the current flowing through the target semiconductor element is higher than the target current, the charge pump circuit may change the body bias voltage to the second body bias voltage VBP2, higher than the first body bias voltage VBP1. As the body bias voltage is increased to the second body bias voltage VBP2, a threshold voltage of the target semiconductor element may be decreased and a difference between the current, flowing through the target semiconductor element, and the target current may be reduced. For example, when the body bias voltage is increased to the second body bias voltage VBP2, an absolute value of the threshold voltage of the target semiconductor element may be increased. Accordingly, the current flowing through the target semiconductor element in the turned-on state may be decreased.

Meanwhile, when the current flowing through the target semiconductor element is lower than the target current, the charge pump circuit may decrease the body bias voltage to the third body bias voltage VBP3. As the body bias voltage is decreased to the third body bias voltage VBP3, an absolute value of the threshold voltage of the target semiconductor element may be decreased and a current flowing through the target semiconductor element in a turned-on state may be reduced.

The body bias voltage, having a level adaptively adjusted by the current flowing through the target semiconductor element, may be input to the body terminal of each of other semiconductor elements having the same type as (same conductivity type as) the target semiconductor element. Accordingly, a deviation of current flowing when each of the semiconductor elements is in a turned-on state may be reduced, and performance of the semiconductor device may be improved.

Figure 10:
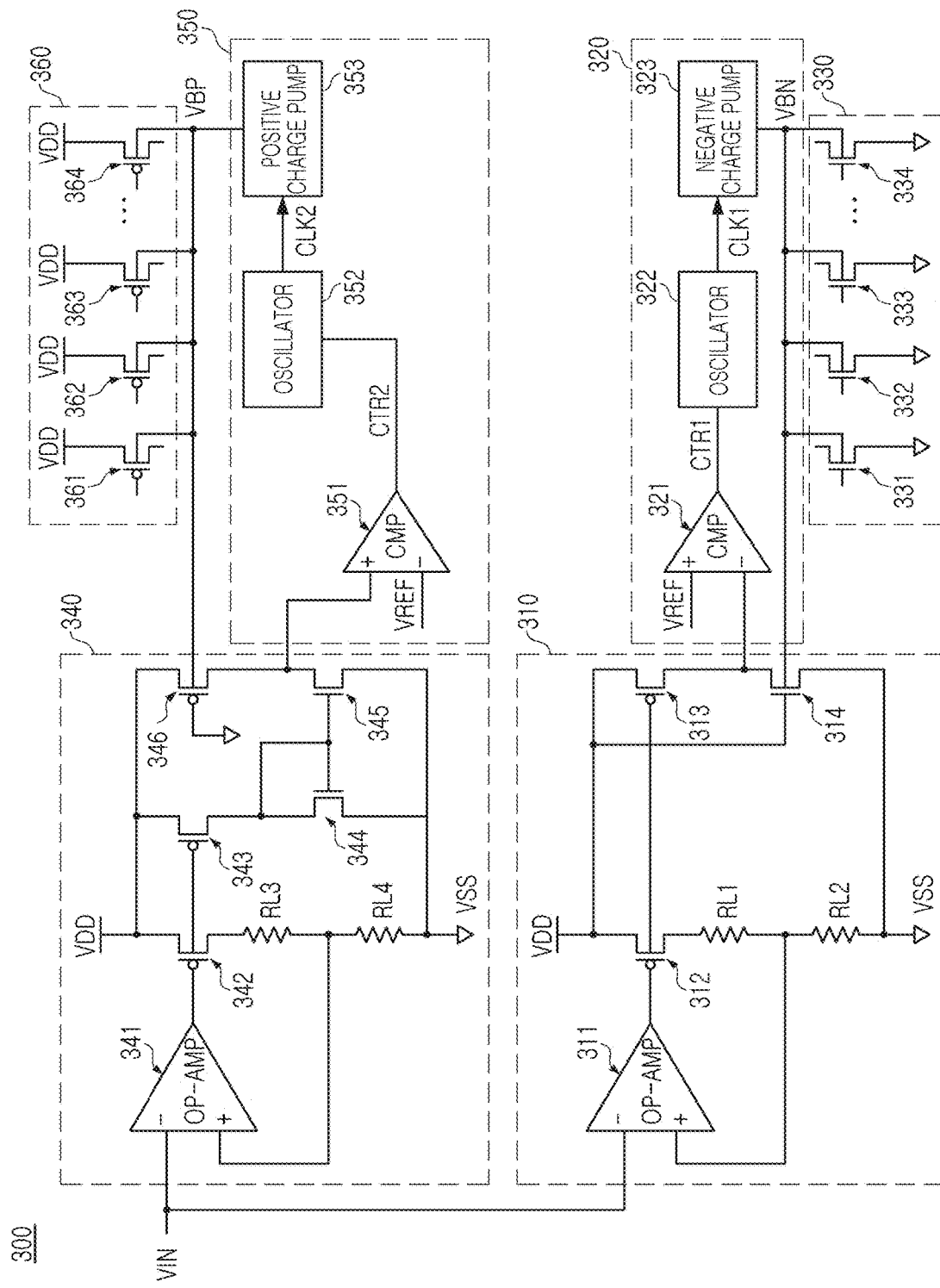
FIG. 10 is a schematic view illustrating a semiconductor device according to various example embodiments.

FIG. 10 is a schematic view illustrating a semiconductor device according to various example embodiments.

Referring to FIG. 10, a semiconductor device 300 according to various example embodiments may include a first body bias voltage generator outputting a first body bias voltage VBN, a second body bias voltage generator outputting a second body bias voltage VBP, and the like. The first body bias voltage generator may include a first current mirror circuit 310, a first charge pump circuit 320, and the like, and the second body bias voltage generator may include a second current mirror circuit 340, a second charge pump circuit 350, and the like.

The first current mirror circuit 310 may include a first operational amplifier 311, a first PMOS element 312, a second PMOS element 313, and a first NMOS element 314. The first operational amplifier 311 may controls target current, determined depending on an input voltage VIN and a first load resistor RL1 and the second load resistor RL2, to flow through the first PMOS element 312, and mirrored current of the target current may flow through the second PMOS element 313 and the first NMOS element 314. The first NMOS element 314, connected to a comparator 321 of the first charge pump circuit 320, may be a target semiconductor element.

The first charge pump circuit 320 may operate depending on current flowing through the first NMOS element 314 in a turned-on state. For example, when the current flowing through the first NMOS element 314 is low, a first enable signal EN1 output by the comparator 321 may be set to a logic low level, and the oscillator 322 may not output a first clock signal CLK1. Accordingly, a negative charge pump 323 may not operate.

Meanwhile, when the current flowing through the first NMOS element 314 is high, the first enable signal EN1 may be set to a logic high level, and the oscillator may output the first clock signal CLK1. Accordingly, the negative charge pump 323 may operate to decrease the first body bias voltage VBN. As an example, the first body bias voltage VBN is a negative voltage lower than 0V, and an absolute value of the first body bias voltage VBN may be increased by an operation of the negative charge pump 323. As the absolute value of the first body bias voltage VBN is increased, a threshold voltage of the first NMOS element 314 may be increased and current flowing through the first NMOS element 314 may be decreased.

The second current mirror circuit 340 may include a second operational amplifier 341, a first PMOS element 342, a second PMOS element 343, a first NMOS element 344, and a second NMOS element 345, a third PMOS element 346, and the like. Similarly to the first current mirror circuit 310, target current determined depending on the input voltage VIN and the third load resistor RL3 and the fourth load resistor RL4 may flow through the first PMOS element 342, and mirrored current of the target current may flow through the third PMOS element 346, the target semiconductor element.

The second charge pump circuit 350 may include a comparator 351, an oscillator 352, a positive charge pump 353, and the like, and the comparator 351 may compare an output voltage, determined depending on the current flowing through the third PMOS element 346 in a turned-on state, with a reference voltage VREF. As an example, when the current flowing through the third PMOS element 346 is low, a second enable signal EN2 may be set to a logic low level, and a positive charge pump 353 may not operate. The second body bias voltage VBP may be a positive voltage higher than 0V.

Meanwhile, when the current flowing through the third PMOS element 346 is high, the comparator 352 may output the second enable signal EN2 having a logic high level. In this case, the positive charge pump 353 may output the second body bias voltage VBP by the second clock signal CLK2 output by the oscillator 352, and a threshold voltage of the third PMOS element 346 may be decreased. Accordingly, the current flowing through the third PMOS element 346 may be decreased.

The first body bias voltage VBN may be input to body terminals of a plurality of NMOS elements 331 to 334 (330 generally). The second body bias voltage VBP may be input to body terminals of a plurality of PMOS elements 361 to 364 (360 generally). When the first body bias voltage VBN and the second body bias voltage VBP are determined as described above, a deviation of current flowing when each of the plurality of NMOS elements 330 is in a turned-on state and a deviation of current flowing when each of the plurality of PMOS elements 360 is in a turned-on state may be significantly reduced. As described above, in various example embodiments, the body bias voltages VBN and VBP may be adaptively improved or optimized without an additional probing operation of determining characteristics of the plurality of semiconductor elements 330 and 360, resulting in improved performance of the semiconductor device 300.

Figure 11:
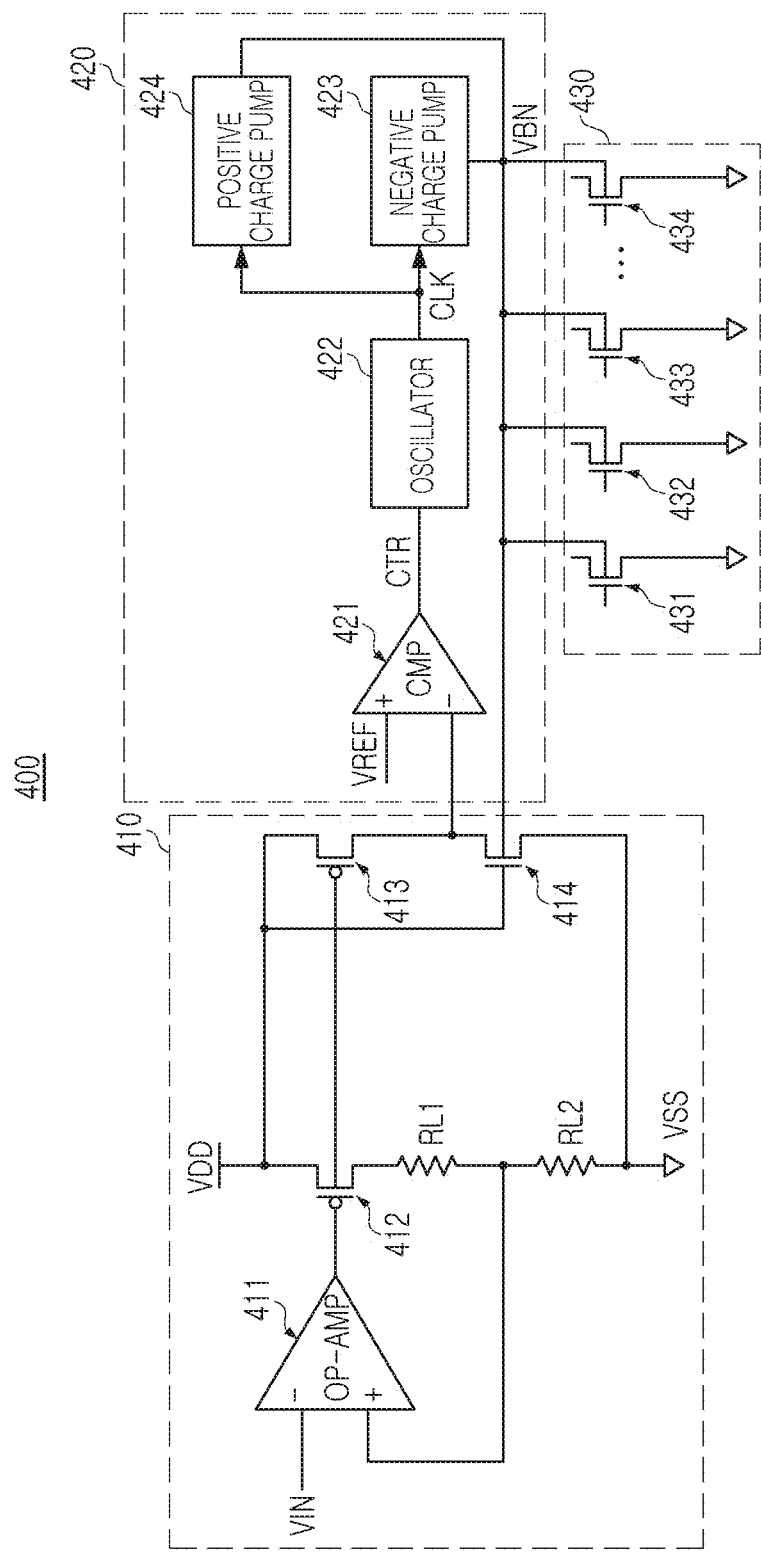
FIGS. 11 and 12 are schematic views illustrating a semiconductor device according to various example embodiments.
Figure 12:
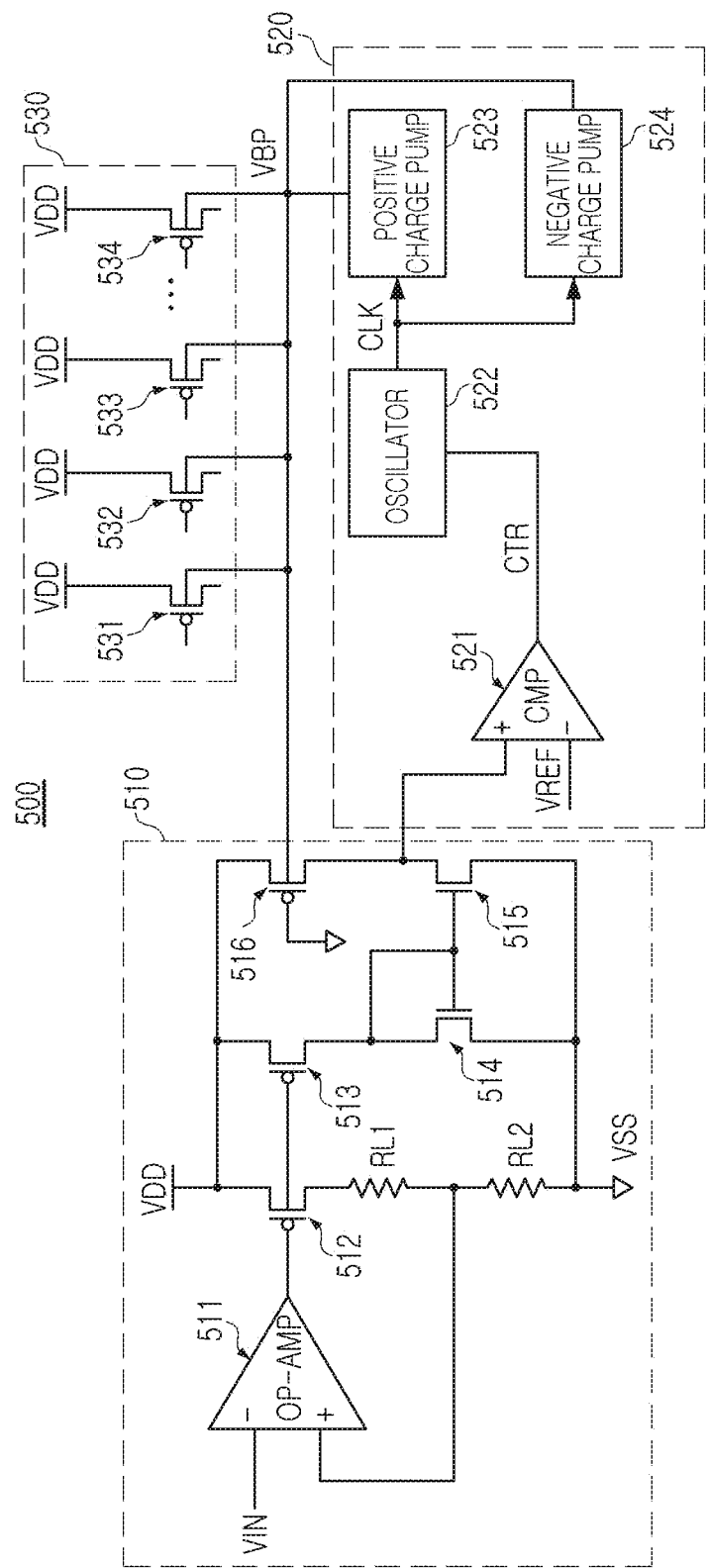

FIGS. 11 and 12 are schematic views illustrating a semiconductor device according to various example embodiments.

Referring to FIG. 11, a semiconductor device 400 according to various example embodiments may include a current mirror circuit 410, a charge pump circuit 420, and a plurality of semiconductor elements 431 to 434 (430 generally). The current mirror circuit 410 may include an operational amplifier 411, a first PMOS element 412, a second PMOS element 413, a first NMOS element 414, a first load resistor RL1, a second load resistor RL2, and the like. An operation of the current mirror circuit 410 may be similar to that in the example embodiments described above with reference to FIGS. 3 and 10. As an example, target current determined by the input voltage VIN may be mirrored to flow through the first NMOS element 414, a target semiconductor element.

The charge pump circuit 420 may include a comparator 421, an oscillator 422, a negative charge pump 423, a positive charge pump 424, and the like. The comparator 421 may compare an output voltage of the first NMOS element 414 with a reference voltage VREF to output a control signal CTR, and the oscillator 422 may output a clock signal CLK in response to the control signal CTR.

As illustrated in FIG. 11, the charge pump circuit 420 may include a negative charge pump 423 and a positive charge pump 424. As an example, the oscillator 422 may output the clock signal CLK to the negative charge pump 423 or the positive charge pump 424 according to the control signal CTR.

When an output voltage of the first NMOS element 414 is lower than the reference voltage VREF, current flowing through the first NMOS element 414 in the turned-on state may be higher than the target current. In this case, the oscillator 422 may output the clock signal CLK to the negative charge pump 423 in response to the control signal CTR, and the body bias voltage VBN may be decreased by the negative charge pump 423. As the body bias voltage VBN is decreased, a threshold voltage of the first NMOS element 414 may be increased and current flowing through the first NMOS element 414 may be decreased.

A case in which the output voltage of the first NMOS element 414 is higher than the reference voltage VREF may correspond to a case in which the current flowing through the first NMOS element 414 in the turned-on state is lower than the target current. In this case, the oscillator 422 may output the clock signal CLK to the positive charge pump 424 in response to the control signal CTR, and thus the body bias voltage VBN may be increased. As the body bias voltage VBN is increased, a body voltage of the first NMOS element 414 may be increased to be higher than the second power supply voltage VSS, a source voltage, a threshold voltage of the first NMOS element 414 may be decreased, and current of the first NMOS element 414 may be increased.

In the example embodiment illustrated in FIG. 11, the charge pump circuit 420 may increase or decrease the body bias voltage VBN according to the current flowing through the first NMOS element 414 in the turned-on state. Accordingly, a current deviation of the semiconductor elements 431 to 434 (430 generally) receiving the same body bias voltage VBN may be effectively and significantly reduced.

As an example, when current characteristics of the semiconductor devices 430 are poor, a forward body bias increasing the body bias voltage VBN may be applied to the semiconductor elements 430. When the current characteristics of the semiconductor devices 430 are good, a reverse body bias decreasing the body bias voltage VBN may be applied to the semiconductor elements 430. Accordingly, a current deviation of the semiconductor elements 430 may be reduced, and a response speed and leakage current of the semiconductor elements 430 may be improved or optimized. As a result, performance of the semiconductor device 400 may be effectively improved.

Referring to FIG. 12, a semiconductor device 500 according to various example embodiments may include a current mirror circuit 510, a charge pump circuit 520, a plurality of semiconductor elements 531 to 534 (530 generally), and the like. The current mirror circuit 510 may include an operational amplifier 511, a first PMOS element 512, a second PMOS element 513, a first NMOS element 514, a second NMOS element 515, a third PMOS element 516, a first load resistor RL1, a second load resistor RL2, and the like. An operation of the current mirror circuit 510 may be similar to that in the example embodiments described above with reference to FIGS. 7 and 10. As an example, target current determined by an input voltage VIN may be mirrored to flow through the third PMOS element 516, a target semiconductor element.

The charge pump circuit 520 may include a comparator 521, an oscillator 522, a positive charge pump 523, a negative charge pump 524, and the like. The comparator 521 may compare an output voltage of the third PMOS element 516 with a reference voltage VREF to output a control signal CTR, and the oscillator 522 may output a clock signal CLK in response to the control signal CTR.

A case in which the output voltage of the third PMOS element 516 is higher than the reference voltage VREF may correspond to a case in which the current flowing through the third PMOS element 516 in the turned-on state is higher than target current. Accordingly, a reverse body bias may be executed to match current of the third PMOS element 516 with the target current.

The oscillator 522 may output the clock signal CLK to the positive charge pump 523 in response to the control signal CTR, and thus, the body bias voltage VBP may be increased. As a body bias voltage VBP, a positive voltage, is increased, the body voltage may become higher than a first power supply voltage VDD, a source voltage of the third PMOS element 516, a threshold of the third PMOS element 516 may be increased, and current of the third PMOS element 516 may be decreased.

A case in which an output voltage of the third PMOS element 516 is smaller than the reference voltage VREF may correspond to a case in which current flowing through the third PMOS element 516 in a turned-on state is lower than the target current. Accordingly, a forward body bias may be executed to increase the current of the third PMOS element 516. As an example, the oscillator 522 may output a clock signal CLK to the negative charge pump 524 in response to the control signal CTR output by the comparator 521, and the body bias voltage VBP may be decreased. As the body bias voltage VBP is decreased, a threshold voltage of the third PMOS element 516 may be decreased and current of the third PMOS element 516 may be increased.

Similarly to that described with reference to FIG. 11, in various example embodiments illustrated in FIG. 12, the charge pump circuit 520 may increase or decrease a body bias voltage VBP depending on current of the third PMOS element 516 maintained in a turned-on state. Accordingly, a current deviation of the semiconductor devices 530 receiving the same body bias voltage VBP may be effectively and significantly reduced. In addition, a forward body bias and a reverse body bias may be selected depending on current characteristics of the semiconductor elements 530, a response speed and leakage current of the semiconductor devices 530 may be improved or optimized to improve performance of the semiconductor device 500.

Figure 13:
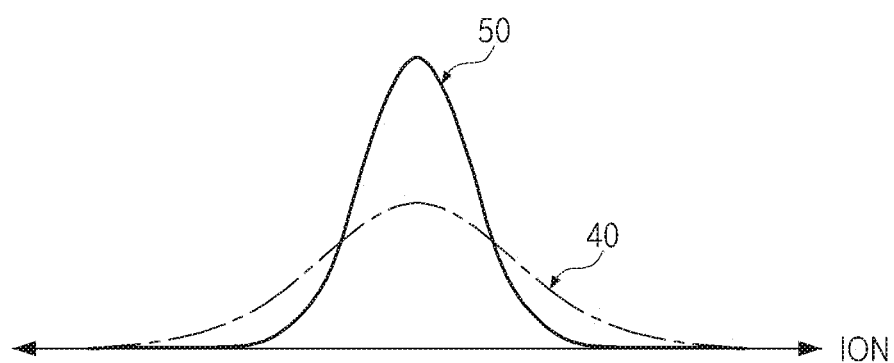
FIG. 13 is a view illustrating an operation of a body bias voltage generator according to various example embodiments.

FIG. 13 is a view illustrating an operation of a body bias voltage generator according to various example embodiments.

FIG. 13 may be a view illustrating a distribution of turn-on current ION flowing through each of the semiconductor elements before and after adjusting a body bias voltage, in the example embodiments described with reference to FIGS. 11 and 12. The turn-on current ION may be current flowing when each of the semiconductor devices is in a turned-on state. Referring to FIG. 13, before adjusting the body bias voltage, the current flowing through each of the semiconductor devices in the turned-on state may be distributed in a wide range as represented by a first graph 40.

The second graph 50 of FIG. 13 may represent a distribution of current flowing through each of the semiconductor elements after a body bias voltage generator adaptively adjusts a body bias voltage based on target current to flow to each of the semiconductor elements in a turned-on state. As described above with reference to FIGS. 11 and 12, in various example embodiments, a forward body bias may be applied when current characteristics of a semiconductor device are poor, and a reverse body bias may be applied when the current characteristics of the semiconductor device are good.

Accordingly, as illustrated in FIG. 13, the second graph 50 may be distributed in a relatively narrower range than the first graph 40. A position, in which turn-on current ION of most semiconductor elements appears in the second graph 50, may be almost the same as a location in which the turn-on current ION of most semiconductor elements appears in the first graph 40. This may be a result of applying a reverse body bias to semiconductor elements having good current characteristics and applying a forward body bias to semiconductor elements having poor current characteristics. Thus, a response speed and leakage current of the semiconductor elements having a trade-off relationship may be improved or optimized to effectively improve performance of the semiconductor device.

FIGS. 14 to 19 are views illustrating an operation of a semiconductor device according to various example embodiments.

FIGS. 14 to 19 may be schematic views illustrating circuits monitoring characteristics depending on a body bias of semiconductor elements included in a semiconductor device according to various example embodiments. The circuits described with reference to FIGS. 14 to 19 may be included in the semiconductor device together with the above-described body bias voltage generator.

Figure 14:
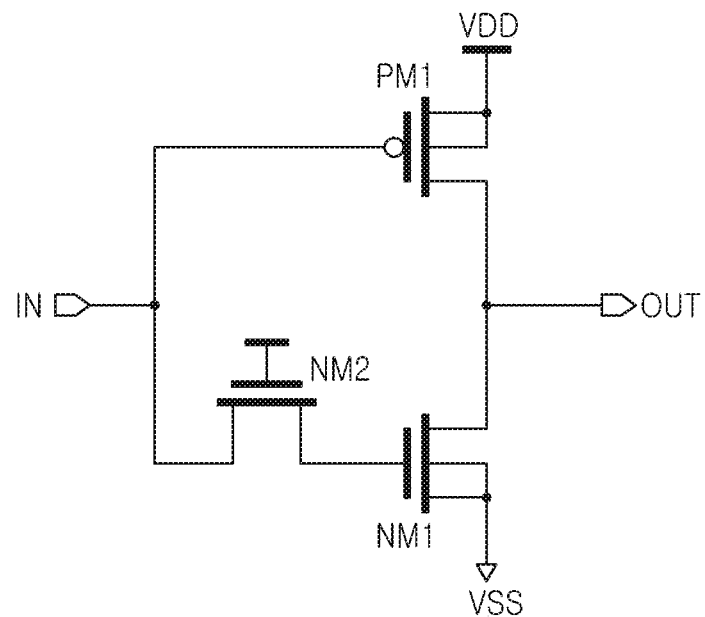
FIGS. 14 to 19 are views illustrating an operation of a semiconductor device according to various example embodiments.
Figure 15:
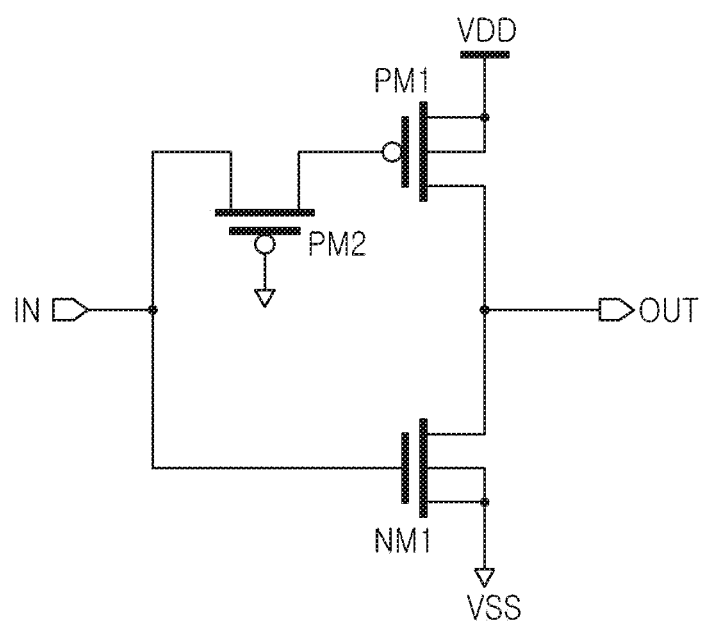

FIGS. 14 and 15 may be views illustrating monitoring circuits having a pass gate structure. Referring to FIGS. 14 and 15, a first PMOS element PM1 and a first NMOS element NM1 may be connected to each other in series, and the first PMOS element PM1 may receive a first power supply voltage VDD and the first NMOS element NM1 may receive a second power supply voltage VSS.

In various example embodiments illustrated in FIG. 14, an input signal IN may be input to a gate of the first PMOS element PM1, while an input signal IN passing through the second NMOS element NM2 may be input to a gate of the first NMOS element NM1 in a turned-on state. Accordingly, delay time between the input signal IN and an output signal OUT may vary depending on characteristics of the second NMOS element NM2. As an example, when the turn-on current of the second NMOS element NM2 is high, the delay time may be decreased. Meanwhile, when the turn-on current of the second NMOS element NM2 is low, the delay time may be increased.

In various example embodiments illustrated in FIG. 15, an input signal IN may be input to a gate of the first NMOS element NM1, while an input signal IN passing through the second PMOS element PM2 may be input to a gate of the first PMOS element PM1 in a turned-on state. Accordingly, delay time between the input signal IN and an output signal OUT may vary depending on characteristics of the second PMOS element PM2.

The delay time between the input signal IN and the output signal OUT in each of the monitoring circuits according to the example embodiments illustrated in FIGS. 14 and 15 may vary depending on a body bias voltage of the second NMOS element NM2 and a body bias voltage of the second PMOS voltage PM2. In the semiconductor device according to various example embodiments, an improved or optimum value for each of the second NMOS element NM2 and the second PMOS element PM2 may be determined based on the delay time between the input signal IN and the output signal OUT. The body bias voltage, input to each of the second NMOS element NM2 and the second PMOS element PM2, may be provided by the body bias voltage generator according to at least one of the above-described embodiments.

As an example, in various example embodiments illustrated in FIG. 14, when the delay time between the input signal IN and the output signal OUT is significantly long, the body bias voltage of the second NMOS element NM2 may be increased to decrease a threshold voltage of the second NMOS element and to increase turn-on current of the second NMOS element NM2. For example, a level of an input voltage input to a current mirror circuit of a body bias voltage generator may be adjusted to increase a voltage output by a charge pump circuit such that a body bias voltage of the second NMOS element NM2 is sufficiently increased.

Figure 16:
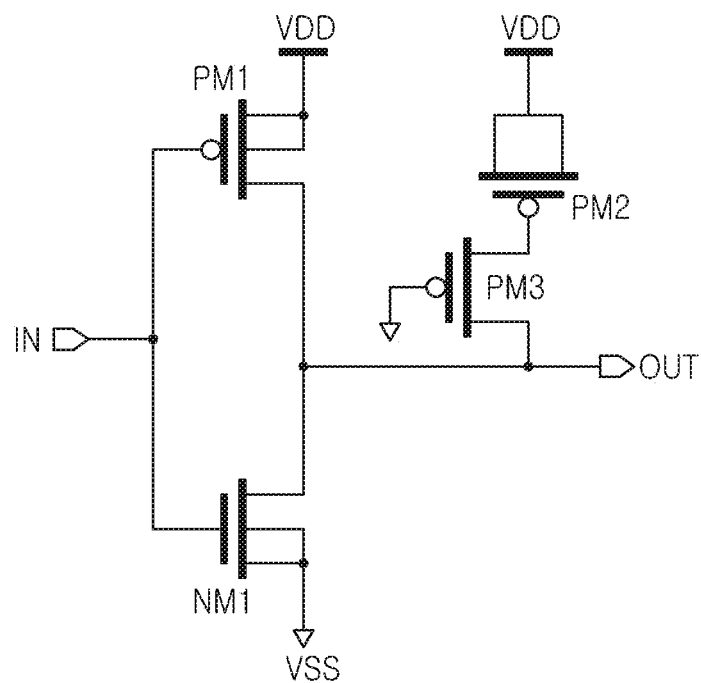
Figure 17:
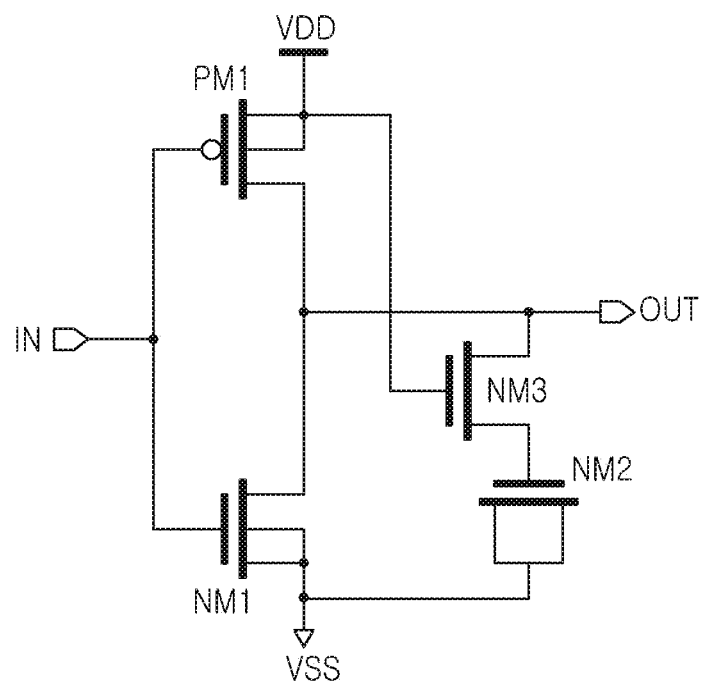

Referring to FIGS. 16 and 17, a first PMOS element PM1 and a first NMOS element NM1 may be connected to each other in series, and the first PMOS element PM1 may receive a first power voltage VDD and the first NMOS element NM1 may receive a second power voltage VSS. In various example embodiments illustrated in FIG. 16, a second PMOS element PM2 and a third PMOS element PM3 may be connected to a node between the first PMOS element PM1 and the first NMOS element NM1, and the second The PMOS element PM2 may operate as a capacitor.

The second PMOS element PM2 may operate as a capacitor connected to the node through which the output signal OUT is output, so that characteristics of the third PMOS element PM3 may affect the delay time between the input signal IN and the output signal OUT. As an example, when the current flowing through the third PMOS element PM3 in the turned-on state is high, the delay time may be decreased, and when the current flowing through the third PMOS element PM3 in the turned-on state is low, the delay time may be increased.

In various example embodiments illustrated in FIG. 17, the second NMOS element NM2 and the third NMOS element NM3 may be connected to a node between the first PMOS element PM1 and the first NMOS element NM1, and the second The NMOS element PM2 may operate as a capacitor connected to a node through which the output signal OUT is output. Accordingly, characteristics of the third NMOS element NM3 may affect the delay time between the input signal IN and the output signal OUT. As an example, when current flowing through the third NMOS element NM3 in a turned-on state is high, the delay time may be decreased, and when the current flowing through the third NMOS element NM3 in the turned-on state is low, the delay time may be increased.

The delay time between the input signal IN and the output signal OUT in each of the monitoring circuits according to various example embodiments illustrated in FIGS. 16 and 17 may vary depending on a body bias voltage of the third PMOS element PM3 and a body bias voltage of the third NMOS voltage NM3. In the semiconductor device according to various example embodiments, an improved or optimal body bias voltage for each of the third PMOS element PM3 and the third NMOS element NM3 may be determined based on the delay time between the input signal IN and the output signal OUT. The body bias voltage input to each of the third PMOS element PM3 and the third NMOS element NM3 may be provided by the body bias voltage generator according to at least one of the above-described embodiments.

As an example, in various example embodiments illustrated in FIG. 16, when the delay time between the input signal IN and the output signal OUT is significantly long, the body bias voltage of the third PMOS element PM3 may be decreased to increase the threshold voltage of the third PMOS element PM3. Since the threshold voltage of the third PMOS element PM3 is a negative voltage lower than or less than 0V, the current flowing through the third PMOS element PM3 in the turned-on state may be increased as the threshold voltage of the third PMOS element PM3 is increased. As an example, a level of the input voltage input to the current mirror circuit of the body bias voltage generator may be adjusted to decrease a voltage output by the charge pump circuit such that the body bias voltage of the third PMOS element PM3 is sufficiently decreased.

Figure 18:
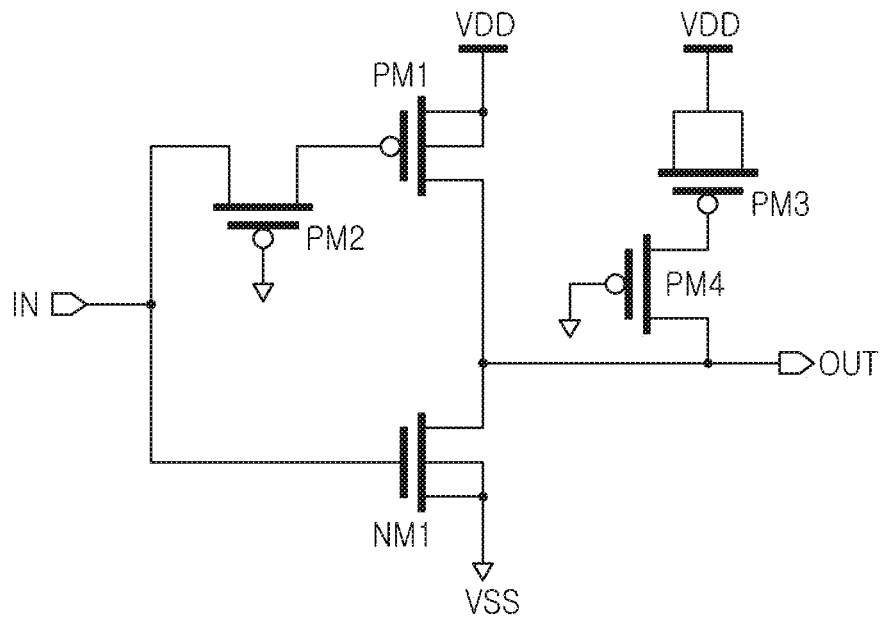
Figure 19:
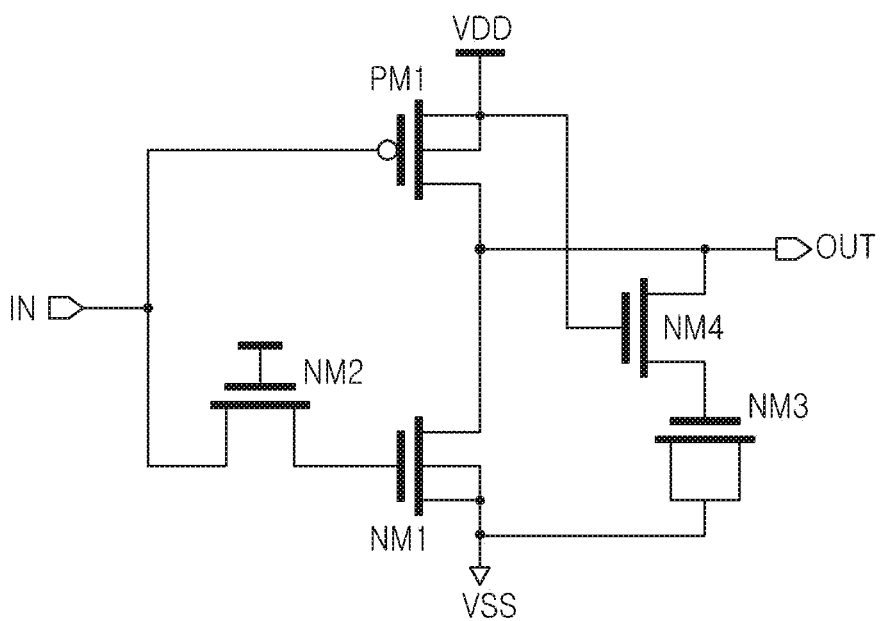

Referring to FIGS. 18 and 19, a first PMOS element PM1 and a first NMOS element NM1 may be connected to each other in series, and the first PMOS element PM1 may receive a first power supply voltage VDD and the first NMOS element NM1 may receive the second power supply voltage VSS. In the example embodiment illustrated in FIG. 18, an input signal IN passing through the second PMOS element PM2 in a turned-on state may be input to a gate of the first PMOS element PM1. A third PMOS element PM3 and a fourth PMOS element PM4 may be connected to a node between the first PMOS element PM1 and the first NMOS element NM1, and the third PMOS element PM4 may operate as a capacitor.

The monitoring circuit according to various example embodiments illustrated in FIG. 18 may have a structure in which the monitoring circuit described with reference to FIGS. 15 and 16 is combined. In the monitoring circuit according to various example embodiments illustrated in FIG. 18, the delay time between the input signal IN and the output signal OUT may vary depending on the characteristics of the second PMOS element PM2 and the fourth PMOS element PM4. For example, when the turn-on currents of the second PMOS element PM2 and the fourth PMOS element PM4 are high, the delay time may be reduced.

In various example embodiments illustrated in FIG. 19, an input signal IN passing through a second NMOS element NM2 in a turned-on state may be input to a gate of a first NMOS element NM1. A third NMOS element NM3 and a fourth NMOS element NM4 may be connected to a node between a first PMOS element PM1 and the first NMOS element NM1, and the third NMOS element NM3 may operates as a capacitor. In the example embodiment illustrated in FIG. 19, delay time between the input signal IN and an output signal OUT may vary depending on characteristics of the second NMOS element NM2 and the fourth NMOS element NM4.

As described above with reference to FIGS. 14 to 17, the body bias voltage input to each of the second PMOS element PM2 and the fourth PMOS element PM4 and the second NMOS element NM2 and the fourth NMOS element NM4 may be controlled by the body bias voltage generator. The semiconductor device according to various example embodiments may adjust the body bias voltage output by the body bias voltage generator such that delay time between the input signal IN and the output signal OUT may be improved or optimized.

In various example embodiments, NMOS elements may be in a first impurity region, e.g. a PWELL region, while PMOS elements may be in a second impurity region, e.g., an NWELL region.

Figure 20:
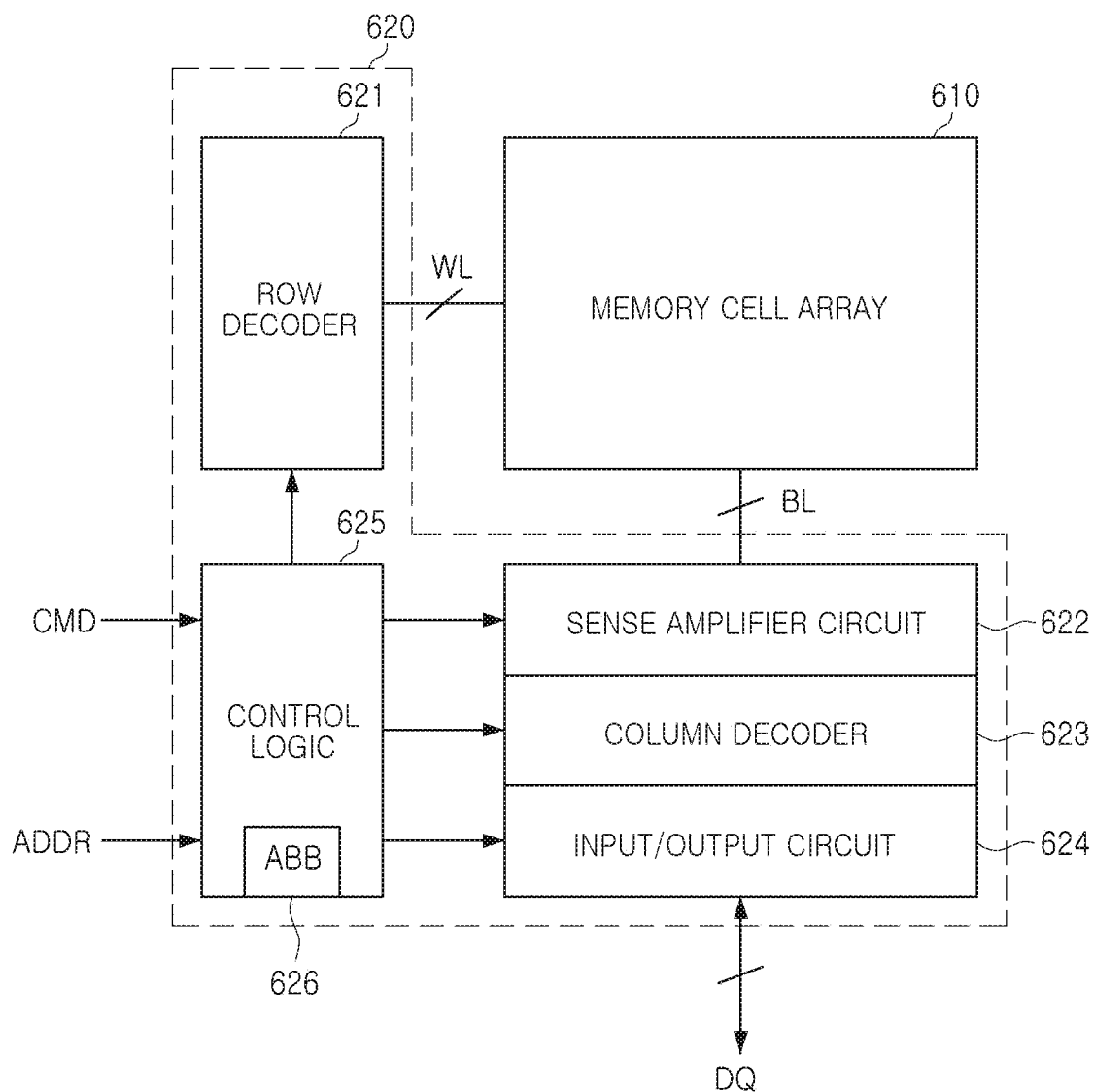
FIGS. 20 and 21 are schematic views illustrating a semiconductor device according to various example embodiments.
Figure 21:
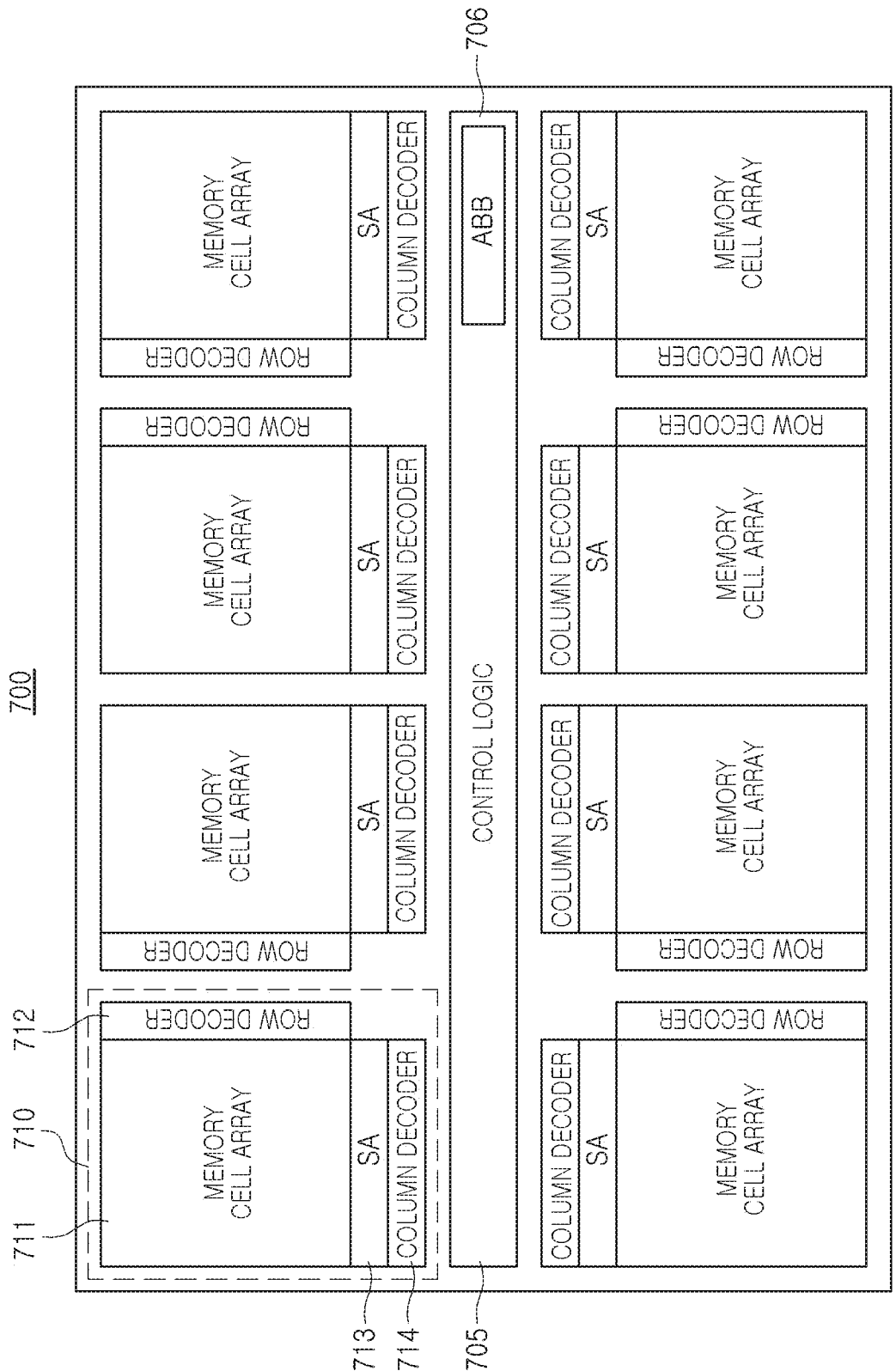

FIGS. 20 and 21 are schematic views illustrating a semiconductor device according to various example embodiments.

Referring to FIG. 20, a semiconductor device 600 may be a memory device capable of storing data and reading stored data. The semiconductor device 600 may include a random access memory (RAM) such as one or more of a dynamic random access memory (DRAM), a synchronous DRAM (SDRAM), a static RAM (SRAM), a double date rate SDRAM (DDR SDRAM), a DDR2 SDRAM, a DDR3 SDRAM, a phase-change RAM (PRAM), a magnetic RAM (MRAM), or a resistive RAM (RRAM). The semiconductor device 600 may store data received through a data signal DQ or output data to the data signal DQ in response to an address signal and a command signal received from an external host (for example, a central processing unit (CPU), an application processor (AP), or a system-on-chip (SoC)). The semiconductor device 600 may include a memory cell array 610 and a peripheral circuit 620, and the peripheral circuit 620 may include a row decoder 621, a sense amplifier circuit 622, a column decoder 623, and an input/output circuit 624, a control logic 625, and the like.

The memory cell array 610 may include a plurality of memory cells, and the plurality of memory cells may be connected to the row decoder 621 and the sense amplifier circuit 622 through a plurality of wordlines WL and a plurality of bitlines BL. The plurality of memory cells may be disposed at intersections of the plurality of wordlines WL and the plurality of bitlines BL. The plurality of memory cells may be disposed in a matrix, in the memory cell array 610. Each of the plurality of memory cells may include at least one memory device storing data. As an example, when the semiconductor device 600 is or includes a DRAM, each of the plurality of memory cells may include a switching element such as a transistor and a cell capacitor or cell memristor.

The control logic 625 may receive an address signal ADDR and/or a command signal CMD from an external host. The address signal ADDR may include a row address, indicating a row in the memory cell array 610, and/or a column address indicating a column in the memory cell array 610. As an example, the row decoder 621 may select at least one of the plurality of wordlines WL based on the row address, and the column decoder 623 may select at least one of the plurality of bitlines BL based on the column address.

The sense amplifier circuit 622 may include a plurality of bitline sense amplifiers connected to the memory cell array 610 through a plurality of bitlines BL. Among the plurality of bitline sense amplifiers, a bitline sense amplifier connected to a selected bitline selected by the column decoder 623 may read data from at least one of memory cells connected to the selected bitline. The input/output circuit 624 may output data, read by the bitline sense amplifier, as a data signal DQ.

The control logic 625 may include a body bias adjustment circuit 626. The body bias control circuit 626 may adjust a body bias voltage of at least some of the semiconductor elements included in the semiconductor device 600. As an example, in the case of a semiconductor element in which current flowing in a turned-on state is significantly high, a response speed may be improved but leakage current may be generated in a turned-off state. Accordingly, the body bias adjustment circuit 626 may apply a reverse body bias to such a semiconductor element.

The body bias adjustment circuit 626 may include a first circuit, adjusting body bias voltages of NMOS elements, and a second circuit adjusting body bias voltages of PMOS elements. As an example, the first circuit may include a negative charge pump outputting a negative voltage, and the second circuit may include a positive charge pump outputting a positive voltage. In some example embodiments, each of the first circuit and the second circuit may include both a negative charge pump and a positive charge pump.

Referring to FIG. 21, a semiconductor device 700 according to various example embodiments may be a memory device, and may include a plurality of unit memory regions 710. As an example, when the semiconductor device 700 is or includes a dynamic random access memory (DRAM), the unit memory region 710 may be defined as a memory bank. Each of the plurality of unit memory areas 710 may include a memory cell array 711, a row decoder 712, a sense amplifier circuit 713, a column decoder 714, and the like.

An operation of the semiconductor device 700 may be controlled by the logic circuit 705. The logic circuit 705 may store externally received data in at least one of the plurality of unit memory areas 710, or may read data from at least one of the plurality of unit memory regions 710 based on externally received address data and may then output the read data to an external entity.

The logic circuit 705 may include an input/output circuit exchanging a signal with an external device. Since the plurality of unit memory regions 710 are disposed on opposite sides adjacent to the logic circuit 705, the logic circuit 705 may be disposed in a center region of the semiconductor device 700. Accordingly, the semiconductor device 700 may be formed to have a center pad structure in which pads are disposed in a center. As a result, interconnection patterns connecting the input/output circuit of the logic circuit 705 and the pads may be efficiently designed.

In various example embodiments, the control logic 705 may include a body bias adjustment circuit 706. The body bias adjustment circuit 706 may adjust a body bias voltage of at least some of semiconductor elements included in the row decoder 712, the sense amplifier circuit 713, the column decoder 714, or the like. As an example, a target semiconductor element, which is the same as at least one of the semiconductor elements included in the row decoder 712, the sense amplifier circuit 713, the column decoder 714, or the like, may be included in the body bias adjustment circuit 706.

The body bias adjustment circuit 706 may include a comparator comparing an output voltage of a target semiconductor element with a reference voltage, a charge pump outputting a body bias voltage according to an output of the comparator, and the like. As an example, the body bias voltage output by the charge pump may be input to a body terminal of the at least one semiconductor element.

As an example, in the case of an NMOS element, a body bias voltage of an NMOS element in which current flowing in a turned-on state is high may be decreased, or an NMOS element in which current flowing in a turned-on state is low may be increased. Meanwhile, in the case of a PMOS element, a body bias voltage of a PMOS element through which a large amount of current flows in a turned-on state may be increased, and/or a body bias voltage of a PMOS element through which a small amount of current flows in a turned-on state may be decreased.

As described above, a threshold voltage of at least some of the semiconductor elements may be changed and current characteristics may be changed by the body bias voltage adjusted by the body bias adjustment circuit 706. In the control logic 705, the body bias adjustment circuit 706 may adaptively adjust a body bias voltage, output to the semiconductor elements by the bias adjustment circuit 706, to reduce or significantly reduce a deviation of current characteristics of the semiconductor elements included in the row decoder 712, the sense amplifier circuit 713, the column decoder 714, and the like.

Accordingly, a deviation of current characteristics of the semiconductor elements may be reduced or significantly reduced without an additional probing operation for measuring current characteristics of the semiconductor elements to improve performance of the semiconductor device 700. Alternatively or additionally, the body bias adjustment circuit 706 may change a body bias voltage in consideration of a change in level of a power supply voltage, so that turn-on current of each of the semiconductor elements may be maintained to be constant even when the power supply voltage is changed.

As set forth above, according to various example embodiments, an output voltage of a target semiconductor element in a turned-on state may be compared with a reference voltage to adjust a body bias voltage of a target semiconductor element such that ON-current of the target semiconductor element matches target current, and a body bias voltage set to the target semiconductor element may be input to a body terminal of other semiconductor elements having the same type as the target semiconductor element. Accordingly, the body bias voltage of the semiconductor element may be adaptively adjusted without additional probing for any of or more than one of process, voltage, temperature (PVT) information monitoring and/or a semiconductor element, and a deviation of characteristics of the semiconductor elements may be reduced to improve performance of the semiconductor device.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been shown and described above, it will be apparent to those of ordinary skill in the art that modifications and variations could be made without departing from the scope of the present inventive concept as defined by the appended claims. Furthermore example embodiments are not necessarily mutually exclusive with one another. For example, some example embodiments may include one or more features described with reference to one or more drawings, and may also include one or more other features described with reference to one or more other drawings.

What is claimed is:

1. A body bias voltage generating circuit comprising:
a current mirror circuit configured to generate and input a target current to a target semiconductor element, the target semiconductor element being in a turned-on state; and
a charge pump circuit including an oscillator configured to output a clock signal based on a result of comparing an output voltage of the target semiconductor element with a reference voltage, and at least one charge pump configured to output a body bias voltage to each of a plurality of semiconductor elements,
wherein each of the plurality of semiconductor elements has a same conductivity type as the target semiconductor element,
the at least one charge pump includes at least one negative charge pump and at least one positive charge pump, and
the oscillator is configured to output the clock signal to the negative charge pump or the positive charge pump.

2. The body bias voltage generating circuit of claim 1, wherein
each of the plurality of semiconductor elements is an NMOS element, and
the at least one charge pump includes a negative charge pump.

3. The body bias voltage generating circuit of claim 2, wherein
the oscillator is configured to increase a frequency of the clock signal to decrease the body bias voltage in response to the output voltage of the target semiconductor element being less than the reference voltage.

4. The body bias voltage generating circuit of claim 2, wherein
the oscillator is configured decrease a frequency of the clock signal to increase the body bias voltage in response to the output voltage of the target semiconductor element being greater than the reference voltage.

5. The body bias voltage generating circuit of claim 1, wherein
each of the plurality of semiconductor elements includes a PMOS element, and
the at least one charge pump includes a positive charge pump.

6. The body bias voltage generating circuit of claim 5, wherein
the oscillator is configured to decrease a frequency of the clock signal to decrease the body bias voltage in response to the output voltage of the target semiconductor element being greater than the reference voltage.

7. The body bias voltage generating circuit of claim 5, wherein
the oscillator is configured to increase a frequency of the clock signal to increase the body bias voltage in response to the output voltage of the target semiconductor element being less than the reference voltage.

8. The body bias voltage generating circuit of claim 1, wherein
each of the plurality of semiconductor elements includes an NMOS element, and
the oscillator is configured to increase a frequency of the clock signal which is output to the negative charge pump, to decrease the body bias voltage in response to the output voltage of the target semiconductor element being lower than the reference voltage.

9. The body bias voltage generating circuit of claim 1, wherein
each of the plurality of semiconductor elements is an NMOS element, and
the oscillator is configured to increase a frequency of the clock signal which is output to the positive charge pump, to increase the body bias voltage in response to the output voltage of the target semiconductor element being greater than the reference voltage.

10. The body bias voltage generating circuit of claim 1, wherein
each of the plurality of semiconductor elements is a PMOS element, and
the oscillator is configured to increase a frequency of the clock signal which is output to the positive charge pump, to increases the body bias voltage in response to the output voltage of the target semiconductor element being less than the reference voltage.

11. The body bias voltage generating circuit of claim 1, wherein
each of the plurality of semiconductor elements is a PMOS element, and
the oscillator is configured to decrease a frequency of the clock signal which is output to the positive charge pump, to decrease the body bias voltage in response to the output voltage of the target semiconductor element being greater than the reference voltage.

12. A semiconductor device comprising:
a memory cell array in which a plurality of memory cells are arranged; and
a peripheral circuit connected to the memory cell array through a plurality of wordlines and a plurality of bitlines and configured to control the plurality of memory cells,
wherein the peripheral circuit includes at least one semiconductor element and the body bias voltage generating circuit of claim 1, and
the body bias voltage generating circuit is configured to control the at least one semiconductor element.

13. A body bias voltage generating circuit comprising:
a plurality of first semiconductor elements in a first impurity region;
a plurality of second semiconductor elements in a second impurity region, different from the first impurity region;
a first comparator configured to compare an output voltage of a first target semiconductor element with a reference voltage, the first target semiconductor element having a same conductivity type as the plurality of first semiconductor elements and configured to receive a first target current;
a first charge pump circuit including a first oscillator configured to operate based on an output of the first comparator, at least one positive charge pump configured to output a positive voltage in response to a first clock signal output by the first oscillator, and at least one negative charge pump configured to output a negative voltage in response to the first clock signal output by the first oscillator;
a second comparator configured to compare an output voltage of a second target semiconductor element with the reference voltage, the second target semiconductor element having a same electrical characteristic as the plurality of second semiconductor elements and configured to receive a second target current; and
a second charge pump circuit including a second oscillator configured to operate based on an output of the second comparator, at least one positive charge pump configured to output a positive voltage in response to a second clock signal output by second oscillator, and at least on negative charge pump configured to output a negative voltage in response to the second clock signal output by the second oscillator.

14. The body bias voltage generating circuit of claim 13, wherein body terminals of the plurality of first semiconductor elements are configured to receive the negative voltage output by the first charge pump circuit, and body terminals of the plurality of second semiconductor elements are configured to receive the positive voltage output by the second charge pump circuit.

15. The body bias voltage generating circuit of claim 13, wherein an output terminal of the first charge pump circuit is connected to a body terminal of the first target semiconductor element, and an output terminal of the second charge pump circuit is connected to a body terminal of the second target semiconductor element.

16. The body bias voltage generating circuit of claim 13, wherein the first impurity region includes a P-well region, and the second impurity region includes an N-well region.

17. The body bias voltage generating circuit of claim 13, wherein an inverting input terminal of the first comparator is configured to receive the output voltage of the first target semiconductor element, and a non-inverting input terminal of the second comparator is configured to receive the output voltage of the second target semiconductor element.

* * * * *